(12) United States Patent
Aoyama et al.

(10) Patent No.: US 7,129,185 B2
(45) Date of Patent: Oct. 31, 2006

(54) SUBSTRATE PROCESSING METHOD AND A COMPUTER READABLE STORAGE MEDIUM STORING A PROGRAM FOR CONTROLLING SAME

(75) Inventors: Shintaro Aoyama, Nirasaki (JP);
Masanobu Igeta, Nirasaki (JP);
Hiroshi Shinriki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/967,284

(22) Filed: Oct. 19, 2004

(65) Prior Publication Data
US 2005/0079720 A1    Apr. 14, 2005

Related U.S. Application Data

(63) Continuation-in-part of application No. PCT/JP03/05032, filed on Apr. 21, 2003.

(51) Int. Cl.
*H01L 21/46* (2006.01)

(52) U.S. Cl. ............ 438/759; 438/906; 438/FOR. 457; 257/E21.471; 257/E21.313; 257/E21.079

(58) Field of Classification Search .................. 438/38, 438/477, 677, 928, 963, 974, FOR. 457, 438/759; 257/E21.313, E21.079, E21.471
See application file for complete search history.

(56) References Cited

U.S. PATENT DOCUMENTS

| | | | | |
|---|---|---|---|---|
| 3,765,935 A | * | 10/1973 | Rand et al. | 257/632 |
| 4,409,570 A | * | 10/1983 | Tanski | 333/187 |
| 4,685,976 A | * | 8/1987 | Schachameyer et al. | 117/92 |
| 5,468,560 A | * | 11/1995 | McPherson et al. | 428/413 |
| 5,661,092 A | * | 8/1997 | Koberstein et al. | 427/515 |
| 5,756,380 A | * | 5/1998 | Berg et al. | 438/126 |
| 5,970,384 A | * | 10/1999 | Yamazaki et al. | 438/795 |
| 6,168,980 B1 | * | 1/2001 | Yamazaki et al. | 438/162 |
| 6,306,560 B1 | * | 10/2001 | Wang et al. | 430/316 |
| 6,329,297 B1 | * | 12/2001 | Balish et al. | 438/714 |
| 6,457,478 B1 | * | 10/2002 | Danese | 134/1.3 |
| 6,961,113 B1 | * | 11/2005 | Hayashi et al. | 355/30 |
| 2002/0160622 A1 | * | 10/2002 | Yamazaki et al. | 438/762 |
| 2002/0182828 A1 | * | 12/2002 | Asami et al. | 438/485 |
| 2003/0148628 A1 | * | 8/2003 | Tay et al. | 438/769 |

FOREIGN PATENT DOCUMENTS

| | | |
|---|---|---|
| JP | 4-196533 | 7/1992 |
| JP | 2002-100627 | 4/2002 |
| JP | 2002-217155 | 8/2002 |
| JP | 2003-1206 | 1/2003 |

* cited by examiner

*Primary Examiner*—Matthew Smith
*Assistant Examiner*—Jarrett Stark
(74) *Attorney, Agent, or Firm*—Oblon, Spivak, McClelland, Maier & Neustadt, P.C.

(57) ABSTRACT

A substrate processing method includes the steps of removing carbon from a surface of a silicon substrate by irradiating an ultraviolet light on the surface in an essentially ultraviolet nonreactive gas atmosphere and forming an oxide film or an oxynitride film on the surface of the silicon substrate by irradiating an ultraviolet light thereon in an essentially ultraviolet reactive gas atmosphere. Further, a computer readable storage medium stores therein a program for controlling the substrate processing method.

17 Claims, 18 Drawing Sheets

DHF clean
UV N$_2$
Ar 1175C 90sec

Rms=0.113nm
PV=1.33nm

DHF clean
UV O$_2$
Ar 1175C 90sec

Rms=1.27nm
PV=11.7nm

DHF clean
Ar 1175C 90sec

Rms=2.09nm
PV=16.1nm

FIG. 11A

```
            7.54
            6.34
6.34  6.29  6.18  6.31  6.4
            6.29
            7.2
                   10.37%
```
Avg. 6.549

FIG. 11B

```
            9.46
            8.85
8.75  8.81  8.83  8.86  8.77
            8.89
            9.27
                    3.95%
```
Avg. 8.943

FIG. 12A

```
            7.19
            6.74
6.84  6.73  6.7   6.77  6.82
            6.76
            7.04
                    3.52%
```
Avg. 6.848

FIG. 12B

```
            7.24
            7.14
7.02  7.13  7.14  7.19  7.03
            7.15
            7.2
                    1.53%
```
Avg. 7.141

SUBSTRATE PROCESSING METHOD AND A COMPUTER READABLE STORAGE MEDIUM STORING A PROGRAM FOR CONTROLLING SAME

This application is a Continuation-In-Part of PCT International Application No. PCT/JP03/05032 filed on Apr. 21, 2003, which designated the United States.

FIELD OF THE INVENTION

The present invention relates to a semiconductor device; and, more particularly, to a substrate processing method for forming a substantially very thin, high quality insulating film on a substrate and a computer readable storage medium storing a program for executing the substrate processing method.

BACKGROUND OF THE INVENTION

With progress in miniaturization, it has become feasible recently to use a gate length of 0.1 μm or less in an ultrahigh speed semiconductor device. Generally, an operational speed of a semiconductor device is improved with miniaturization, while in such a highly miniaturized semiconductor device, the thickness of a gate insulating film needs to be reduced in accordance with a scaling law with the miniaturization, in addition to a reduction in the gate length. Thus, in case the gate length is reduced to 0.1 μm or less, it is necessary to set the thickness of the gate insulating film to 1–2 nm or smaller when a conventional silicon thermal oxide film is used for the gate insulating film. In such an extremely thin gate insulating film, a tunneling current is increased, which in turn inevitably increases a gate leakage current.

Under such a situation, there has been a proposal of using as the gate insulating film a high-k dielectric material, such as $Ta_2O_5$, $Al_2O_3$, $ZrO_2$, $HfO_2$, $ZrSiO_4$ or $HfSiO_4$, having a dielectric constant much larger than that of the conventional silicon thermal oxide film, whose film thickness will become small when converted into a silicon thermal oxide film despite a large actual film thickness.

In a semiconductor device that uses such a high-k dielectric film for the gate insulating film, it is preferable to form the high-k dielectric film directly on a silicon substrate in order to reduce an effective thickness of the insulating film converted into the silicon thermal oxide film. However, in the case of forming the high-k dielectric film directly on the silicon substrate, metal elements in the high-k dielectric film tend to diffuse into the silicon substrate to thereby cause a carrier scattering problem in a channel region.

From the viewpoint of improving carrier mobility in the channel region, it is preferable to interpose an extremely thin base oxide film of a thickness of 1 nm or less, preferably 0.8 nm or less, between the high-k dielectric gate oxide film and the silicon substrate. Such an extremely thin base oxide film has to cover the surface of the silicon substrate uniformly, without forming defects such as interface states.

Conventionally, a thin gate oxide film used to be formed by a rapid thermal oxidation (RTO) on a silicon substrate. When forming a thermal oxide film of a desired thickness of 1 nm or less, it is necessary to reduce a processing temperature used at the time of film formation. However, the thermal oxide film formed at a low temperature is liable to include defects such as the interface states and is deemed inappropriate to be used for the base oxide film of the high-k dielectric gate oxide film.

Therefore, in forming a base oxide film, the inventors of the present invention have previously proposed to use a UV-excited oxygen radical (UV-$O_2$ radical) substrate processing unit capable of forming a high-quality oxide film at a low film forming speed based on a low radical density (see Japanese Patent Laid-open Application No. 2002-100627).

FIG. 21 shows a schematic configuration of a conventional UV-$O_2$ radical substrate processing unit 100. Referring to FIG. 21, the substrate processing unit 100 includes a processing chamber 101 for keeping a substrate 102 under a depressurized environment, wherein the substrate 102 to be processed is held on a susceptor 101A provided with a heater 101a. Further, there is provided a shower head 101B in the processing chamber 101 which is arranged to face the substrate 102 held on the susceptor 101A, and an oxidizing gas, such as an oxygen gas, $O_3$, $N_2O$, NO or a mixture thereof, is supplied to the shower head 101B.

The shower head 101B is formed of a material transparent to an ultraviolet light such as quartz, and there is provided a window 101C, formed of quartz and the like, for transmitting the ultraviolet light into the processing chamber 101, such that the window 101C exposes the substrate 102 to be processed on the susceptor 101A. Further, outside the window 101C, there is provided an ultraviolet source 103 which is movable along the surface of the window 101C.

A silicon substrate as the substrate 102 to be processed is introduced into the processing chamber 101 shown in FIG. 21, and an oxidizing gas such as oxygen is introduced after vacuum evacuation to depressurize the inside of the processing chamber 101. Further, by activating the ultraviolet source 103, active radicals 0* are formed in the oxidizing gas. Such radicals activated by the ultraviolet light oxidize the exposed surface of the silicon substrate 102 and, thereby forming an extremely thin oxide film with a thickness ranging from about 0.4 to 0.8 nm on the surface of the silicon substrate 102.

In the substrate processing unit 100 shown in FIG. 21, it is possible to form the oxide film with a uniform thickness by moving the ultraviolet source 103 along the optical window 101C.

Because the oxide film thus formed is obtained by employing the UV-$O_2$ oxidation process, the oxide film contains little defects such as interface states and is suitable for the base oxide film provided underneath the high-k dielectric gate insulating film, as reported by Zhang, et al. (Zhang, J-Y, et al.; Appl. Phys. Lett. 71(20), Nov. 17, 1997, pp. 2964–2966).

As described above, the base oxide film provided underneath the high-k dielectric gate insulating film needs to be extremely thin, and it is realizable to form a base oxide film having a thickness of about 0.8 nm by using a UV-$O_2$ radical substrate processing unit.

On the other hand, conventionally it is noted that when a metal oxide film which has a small number of covalent bonds, i.e., a low stiffness, is formed directly on a single crystalline silicon substrate which has a large number of covalent bonds, i.e., a high stiffness, an interface between the silicon substrate and the metal oxide film becomes kinetically unstable, so that defects can be formed. In order to overcome such a problem, it is proposed that an oxynitride layer having a single atomic layer of nitrogen introduced therein is formed as a transition layer at the interface between the silicon substrate and the metal oxide film. Further, it is considered that forming such an oxynitride film as a base oxide film for the high-k dielectric gate insulating film suppresses a mutual diffusion of metal elements or oxygen in the high-k dielectric gate insulating film and silicon in the silicon substrate to thereby effectively prevent a diffusion of dopants from an electrode. In forming such an oxynitride layer, there is proposed a technique for nitriding a surface of an oxide film by using a microwave excited remote plasma (see G. Lucovsky, Y. Wu, H. Niimi, V. Misra, and J. C. Phillips; Appl. Phys. Lett. 74(14), Apr. 5, 1999, pp. 2005–2007; and ninth embodiment of Japanese Patent Laid-open Application No. 2002-1.00627).

Meanwhile, deterioration in quality of a thermal oxide film due to organic contamination of the silicon substrate surface occurring before growing the oxide film was pointed out long time ago in conventionally performed formation of a gate oxide film by using silicon thermal oxide film (for example, S. R. Kasi and M. Liehr; J. Vac. Sci. Technol. A 10(4), July/August 1992, pp.795–801). As the gate insulating film becomes getting thinner, it becomes more important to take effects resulting from the organic contamination into account when performing a process.

However, generally in a nitriding process using the microwave, an extremely high vacuum level of about $1.33 \times 10^{-1}$ to $1.33 \times 10^{-4}$ Pa ($10^{-3}$ to $10^{-6}$ Torr) is required. When nitriding at such an extremely high vacuum level, effects attributed to a small amount of impure material such as oxygen or water remaining in the processing chamber become non-negligible, so that the oxide film can be thickened in nitriding. When the oxide film is thickened in oxynitriding, the advantageous effects achieved by using the high-k dielectric gate insulating film are offset. As described above, it has been difficult to nitride the extremely thin oxide film stably and reproducibly without thickening by oxidation at such a vacuum level as can be easily achieved to be used in a general semiconductor process.

SUMMARY OF THE INVENTION

In order to overcome the above drawbacks, it is, therefore, an object of the present invention to provide a novel, useful substrate processing method; and more specifically, a substrate processing method for stably and reproducibly forming an extremely thin oxide film directly on a silicon substrate without being affected by the organic contamination.

In accordance with a first aspect of the present invention, there is provided substrate processing method, including the steps of: removing carbon from a surface of a silicon substrate by irradiating an ultraviolet light on the surface in an essentially ultraviolet nonreactive gas atmosphere; and forming an oxide film or an oxynitride film on the surface of the silicon substrate by irradiating an ultraviolet light thereon in an essentially ultraviolet reactive gas atmosphere.

In the substrate processing method, the ultraviolet nonreactive gas is a nitrogen gas, and the ultraviolet reactive gas is an oxygen gas.

Further, there is provided a computer readable storage medium storing therein a program for controlling the substrate processing method.

In accordance with a second aspect of the present invention, there is provided a substrate processing method, including the steps of: removing carbon from a surface of a silicon substrate by irradiating an ultraviolet light on the surface in a nitrogen gas atmosphere; supplying a NO gas to the surface of the silicon substrate; and exciting the NO gas by an ultraviolet light to form an oxynitride film on the surface of the silicon substrate.

In the substrate processing method, the ultraviolet light has a wavelength ranging from 145 to 192 nm, preferably, a wavelength of about 172 nm.

Further, there is provided a computer readable storage medium storing therein a program for controlling the substrate processing method.

In accordance with a third aspect of the present invention, there is provided a substrate processing method, including the steps of: loading a silicon substrate into a processing chamber; heating the silicon substrate; removing carbon from a surface of a silicon substrate by irradiating an ultraviolet light on the surface in an essentially ultraviolet nonreactive gas atmosphere; and forming an oxide film or an oxynitride film on the surface of the silicon substrate by irradiating an ultraviolet light thereon in an essentially ultraviolet reactive gas atmosphere, wherein the step of removing the carbon is performed at a temperature of the silicon substrate not exceeding 450° C.

In the substrate processing method, the essentially ultraviolet nonreactive gas is a nitrogen gas, and the essentially ultraviolet reactive gas is a NO gas.

Further, there is provided a computer readable storage medium storing therein a program for controlling the substrate processing method.

In accordance with a fourth aspect of the present invention, there is provided a substrate processing method, including the steps of: loading a silicon substrate into a processing chamber; heating the silicon substrate; removing carbon from a surface of the silicon substrate by irradiating an ultraviolet light on the surface in an essentially ultraviolet nonreactive gas atmosphere; and forming an oxide film or an oxynitride film on the surface of the silicon substrate by irradiating an ultraviolet light thereon in an essentially ultraviolet reactive gas atmosphere, wherein the step of removing the carbon and the step of forming the oxide film or the oxynitride film are performed in the same processing chamber.

In the substrate processing method, the essentially ultraviolet nonreactive gas is a nitrogen gas, and the essentially ultraviolet reactive gas is a NO gas.

It is preferable that the step of removing the carbon is performed at a temperature of the silicon substrate not exceeding 450° C.

Further, there is provided a computer readable storage medium storing therein a program for controlling the substrate processing method.

In accordance with a fifth aspect of the present invention, there is provided a substrate processing method, including the steps of: removing carbon from a surface of a silicon substrate by irradiating an ultraviolet light on the surface in a nitrogen gas atmosphere; supplying a NO gas to the surface of the silicon substrate; and exciting the NO gas by an ultraviolet light to form an oxynitride film on the surface of the silicon substrate, wherein the steps are performed successively to control a nitrogen concentration in the oxynitride film.

Further, there is provided a computer readable storage medium storing therein a program for controlling the substrate processing method.

In accordance with the present invention, oxynitriding can be performed without being affected by the organic contamination on the silicon surface. Further, it is possible to remove unstabilities in film thickness, nitrogen concentration and nitrogen depth profile and to form oxynitride films stably and reproducibly. Furthermore, the present invention is a technique applicable to a conventional oxide film forming.

BRIEF DESCRIPTION OF THE DRAWINGS

The above and other objects and features of the present invention will become apparent from the following description of preferred embodiments, given in conjunction with the accompanying drawings, in which:

FIG. 4 sets forth photoelectron spectrums obtained by an XPS analysis on silicon substrate samples which the substrate processing method in accordance with embodiments of the present invention is performed on;

FIGS. 11(A) and 11(B) offer a film thickness distribution in case UV-NO nitriding is carried out on the oxide film formed on the silicon substrate in accordance with a first embodiment of the present invention;

FIGS. 12(A) and 12(B) provide a film thickness distribution in case an oxynitride film is formed directly on the silicon substrate by UV-NO nitriding in accordance with the first embodiment of the present invention;

DETAILED DESCRIPTION OF THE PREFERRED EMBODIMENTS

First Embodiment

Figure 1:
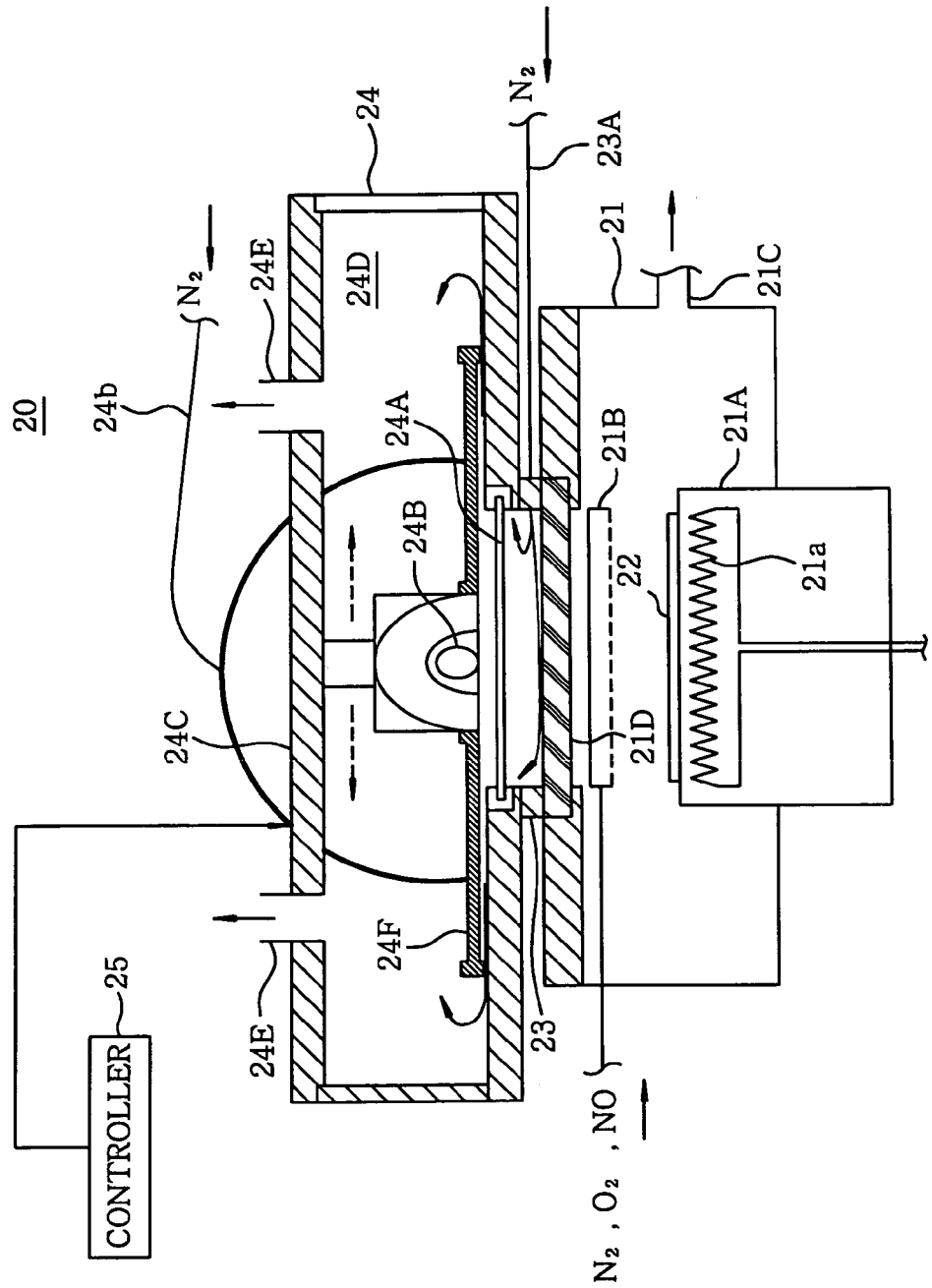
FIG. 1 shows a vertical sectional view describing a configuration of a substrate processing unit used in the present invention.

Hereinafter, a first embodiment of the present invention will be described. In the present invention, a UV-$N_2$ process is performed on a surface of a silicon substrate to remove carbon thereon. Then, a UV-NO radical process is performed on the surface of the silicon substrate to form an oxynitride film directly thereon. FIG. 1 is a vertical sectional view showing a configuration of a UV radical substrate processing unit (a reaction chamber) 20 used in the present invention; FIG. 2 illustrates images of a silicon substrate, representing an effect of removing carbon by employing a UV-$N_2$ process, obtained by using an atomic force microscope (AFM); and FIG. 3 depicts a plane view of a cluster processing apparatus 60 including the substrate processing unit 20 in accordance with embodiments of the present invention.

As shown in FIG. 1, the substrate processing unit 20 includes a processing chamber 21 having a susceptor 21A for holding a substrate 22 to be processed thereon, and a shower head 21B formed of a material such as quartz transparent to an ultraviolet light and disposed to face the substrate 22 to be processed on the susceptor 21A. The processing chamber 21 is exhausted through a gas exhaust port 21C, and an oxygen gas or a NO gas is supplied to the shower head 21B from an external gas source. Also disposed in the processing chamber 21 is an optical window 21D formed of a material such as quartz transparent to an ultraviolet light above the shower head 21B so as to expose the shower head 21B and the substrate 22 to be processed therebelow. Installed in the susceptor 21A is a heater 21a for heating the substrate 22 to be processed.

Further, disposed on the processing chamber 21 is an ultraviolet exposure unit 24 via a combining part 23 corresponding to the optical window 21D. The ultraviolet exposure unit 24 includes a quartz optical window 24A corresponding to the optical window 21D and an ultraviolet source 24B irradiating an ultraviolet light on the substrate 22 to be processed via the quartz optical window 24A and the optical window 21D, wherein the ultraviolet source 24B can move in a direction parallel to the optical window 24A by a robot 24C as indicated by arrows in FIG. 1.

In the illustrated example, the ultraviolet source 24B is formed of a linear light source extending in a direction approximately perpendicular to the moving direction of the ultraviolet source 24B. An excimer lamp having a wavelength of, e.g., 172 nm is used for the linear light source in the present invention.

Further, in a configuration of FIG. 1, a nonreactive gas such as $N_2$ is supplied to the combining part 23 from an external gas source (not shown) via a line 23A such that an ultraviolet light generated by the ultraviolet source 24B is not absorbed by oxygen in the air before the ultraviolet light is introduced into the processing chamber 21 through the optical window 21D. The nonreactive gas flows into a space 24D inside the ultraviolet exposure unit 24 through a gap formed in a portion where the optical window 24A is attached to the ultraviolet exposure unit 24.

Further, in order to prevent oxygen in the air from flowing into a region right underneath the ultraviolet source 24B as the ultraviolet source 24B is operated, there is provided a shielding plate 24F at both sides of the ultraviolet source 24B, and a nonreactive gas such as $N_2$ is supplied into a region having a small height of about 1 mm, which is formed between the optical window 24A facing to the ultraviolet source 24B and the shielding plate 24F, via a line 24b.

The region is also supplied with the nonreactive gas from the line 23A and, as a result, oxygen absorbing the ultraviolet light is effectively eliminated from the region.

The nonreactive gas which passes through the region underneath the shielding plate 24F flows into the space 24D and is then discharged to the outside of the ultraviolet exposure unit 24 through gas exhaust ports 24E formed in the ultraviolet exposure unit 24.

In the ultraviolet exposure unit 24 of the substrate processing unit shown in FIG. 1, the robot 24C can control a movement and scanning of the ultraviolet source 24B and, thus, it becomes possible to control a film thickness distribution by controlling the amount of ultraviolet irradiation when forming oxynitride film on the surface of the substrate 22 to be processed by the ultraviolet activated oxynitriding. The robot 24C is controlled by a controller 25 such as a computer. Further, the controller 25 controls an operation of the ultraviolet source 24B as well.

Furthermore, it is preferable that the controller 25 is configured to control operations of additional electrical and mechanical components, e.g., a wafer loading mechanism (not shown) for loading the silicon substrate 22 into the processing chamber 21; a heater power supply (not shown) for supplying a power to the heater 21a; external gas sources (not shown) for supplying a gas, e.g., to the combining part 23 and the shower head 21B, and underneath the shielding plate 24F; and/or a gas exhaust unit (not shown) for exhausting a gas via gas exhaust ports 21C and 24E. The controller 25 can be implemented by a general purpose computer, e.g., PC (personal computer), which has, e.g., a CPU, a mother board (MB), a hard disk (HD), memories such as ROM and RAM, a CD/DVD drive and so on. In such a case, the process control can be carried out in a completely automated manner under the control of a control program or a software running on the controller 25. Though not specifically depicted in FIG. 1, control signals are provided from the controller 25 to the aforementioned additional electrical and mechanical components via controller lines (not shown). The control program can be directly programmed on the controller 25 or can be programmed outside and provided thereto via, e.g., a network or the CD/DVD drive and then stored in, e.g., the hard disk for the execution thereof. The control program may also reside in any storage medium, e.g., a CD or DVD disc, for the execution thereof.

All of the processes and conditions thereof related with the substrate processing methods carried out in accordance with the present invention can be preferably controlled in a fully automated manner by the control program running on the controller 25. Further, it should be also appreciated that the substrate processing method of the present invention may also be controlled by more than one controllers or computers as well.

Hereinafter, a sequence of a substrate processing method in accordance with the present embodiment will be described. In order to execute the substrate processing method in accordance with the present embodiment, a carbon removing process is performed on the silicon substrate. The carbon removing process employs the substrate processing unit 20 shown in FIG. 1 and the carbon removing process is performed in the absence of oxygen in the substrate processing unit 20.

Specifically, carbon on the substrate is removed from the substrate after preparing an oxygen-free environment in the processing chamber 21 by substituting a nitrogen gas for the air in the processing chamber 21. That is, the silicon substrate as a substrate to be processed is mounted on the susceptor 21A in the processing chamber 21 of the substrate processing unit 20 and the processing chamber 21 is filled with a depressurized nitrogen gas. Then, an ultraviolet lamp is turned on and operated to remove carbon on the surface of the silicon substrate.

Specifically, the silicon substrate 22 to be processed is mounted on the susceptor 21A provided with the heater 21a at room temperature, as shown in FIG. 1. An atmosphere of nitrogen gas is prepared by performing an exhaust through the gas exhaust port 21C, and the substrate 22 is heated by the heater 21a during the ultraviolet irradiation by the ultraviolet source 24B. Then, the heater gradually increases the temperature of the silicon substrate, introduced into the processing chamber at room temperature, toward a set temperature. Carbon compounds on the silicon substrate are converted into low molecular weight compounds by energy of the ultraviolet irradiation; dispersed and evaporated by an increase of the substrate's temperature; and finally exhausted, whereby they are readily removed. It is preferable that an actual temperature of the substrate is 450° C. or lower when the substrate is irradiated with an ultraviolet light in $N_2$ atmosphere.

According to Technical Report of IEICE., SDM2002-189 (2002-10), since carbon reacts with silicon to thereby produce SiC rapidly at 450° C. or higher, it is preferable that a process is performed at 450° C. or lower.

In a following process of forming an oxynitride film by irradiating an ultraviolet light on the surface of the silicon substrate, a temperature of 450° C. or higher is preferable, though. A higher temperature is preferable for a favorable film quality. Thus, a processing temperature in a range from 700 to 750° C. is preferable when taking the demand for a high quality of a device into consideration. In this case, a substantially thin oxynitride film with an excellent quality is formed precisely and stably within a few seconds. It is also possible that respective temperatures in the carbon removing process and the film forming process are controlled precisely by using an infrared lamp and the like as a source for heating the silicon substrate.

Hereinafter, there will be described a method for performing the film forming process at a temperature ranging from 700 to 750° C. and the carbon removing process at 450° C. or lower in the same chamber.

Before mounting the silicon substrate inserted into the processing chamber at a room temperature on the heated susceptor, the ultraviolet light is irradiated at a position of the inserted substrate which is located away from the susceptor in depressurized environment of nitrogen, preferably at several tens of mTorr, by using the ultraviolet source. Since irradiation from the susceptor and heat conduction by a nitrogen gas increase the substrate's temperature relatively slowly, before reaching 450° C., the carbon compounds on the substrate surface are converted into low molecular weight compounds by the ultraviolet light and are easily exhausted after dispersion and evaporation in the depressurized atmosphere. Thereafter, the silicon substrate is mounted on the heated susceptor and a process for forming a desired oxynitride film is performed thereon. The pressure of nitrogen has to be kept low such that the heat conduction of gas is reduced to thereby assist dispersion of the carbon compounds.

Hereinafter, an effect of removing carbon is represented in terms of roughness of the silicon surface created by a high-temperature Ar annealing followed by the carbon removing process.

Figure 2C:
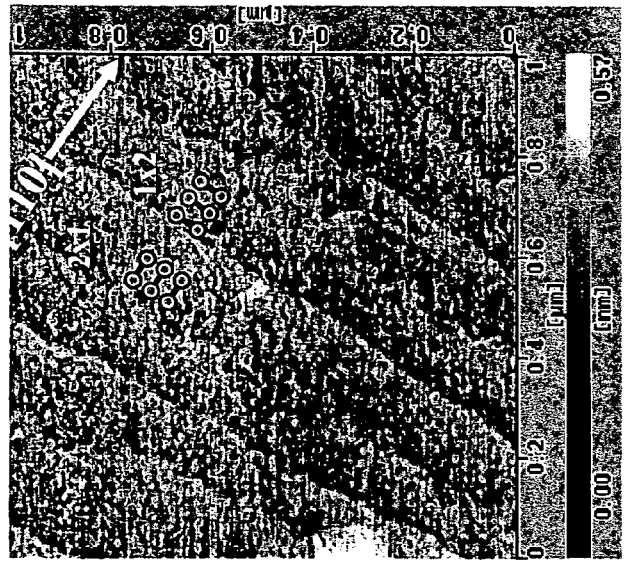
FIG. 2 illustrates images of a silicon substrate, whereon a substrate processing method of embodiments of the present invention is performed, obtained by using an atomic force microscope (AFM)
Figure 2B:
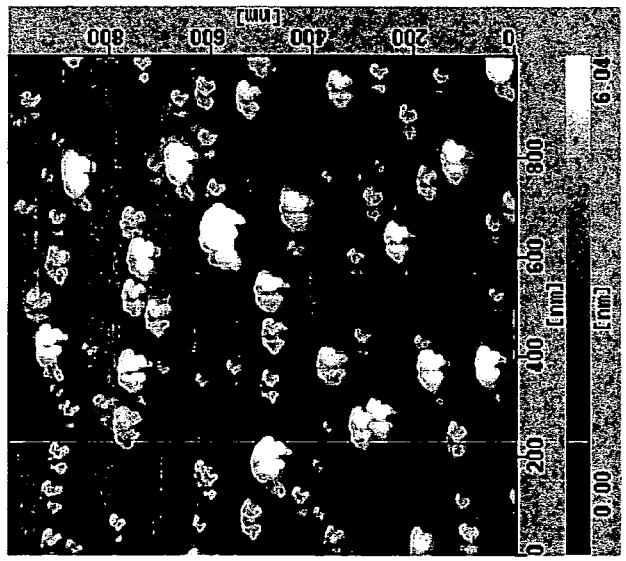
Figure 2A:
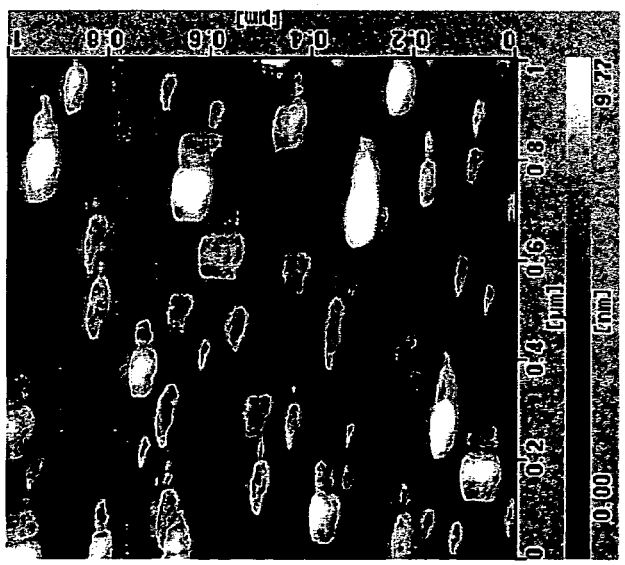
Figure 3:
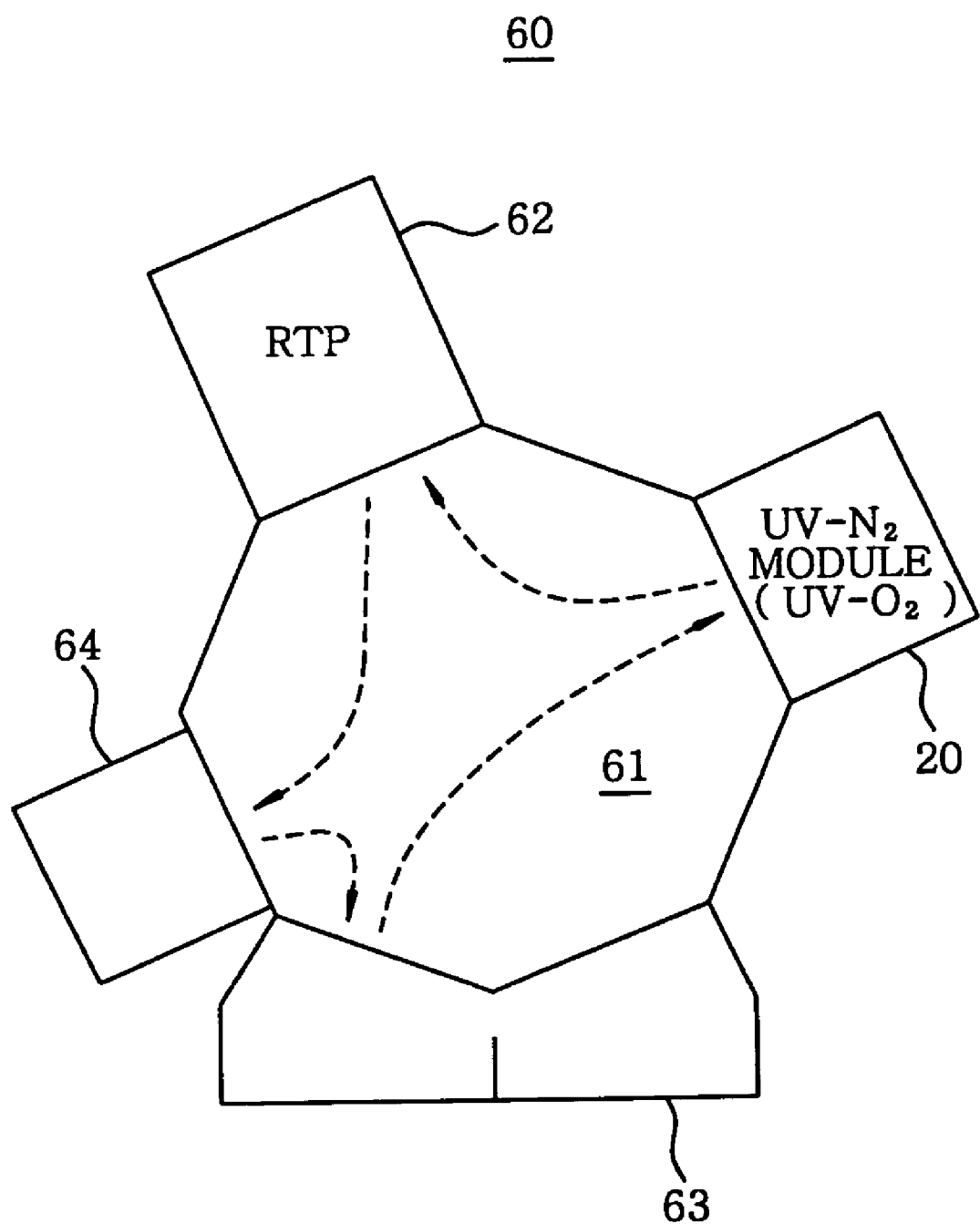
FIG. 3 depicts a plane view of a cluster processing apparatus including the substrate processing unit in accordance with embodiments of the present invention.

FIGS. 2(A) to 2(C) are images showing the substrate surface obtained by using an atomic force microscope (AFM), in case that a native oxide film is removed from the silicon substrate 22 by DHF process (DHF cleaning); the silicon substrate 22 is introduced into the substrate processing unit 20 shown in FIG. 1; the silicon substrate 22 is irradiated by ultraviolet light in an atmosphere of another gas; and heat treatment is performed on the substrate for 90 seconds at 1175° C. and 1060 Pa in Ar atmosphere.

However, FIG. 2(A) is for comparison and shows a case where a planarization process instead of processing in the substrate processing unit 20 is performed on the silicon substrate 22 after DHF cleaning process. On the other hand, FIG. 2(B) represents a result obtained in case the silicon substrate is processed for five minutes in the substrate processing unit 20 by introducing an oxygen gas therein from the shower head 21B at a flow rate of 150 SCCM and operating the ultraviolet source 24B at a pressure of about 2.66 Pa ($2 \times 10^{-2}$ Torr) and a substrate temperature of 450° C. Further, FIG. 2(C) presents the substrate whereon the same process as in FIG. 2(B) is performed by introducing a nitrogen gas in lieu of an oxygen gas from the shower head 21B.

In the experiments of FIGS. 2(A) to 2(C), as shown in FIG. 3, the heat treatment is performed in the cluster substrate processing unit 60 wherein the substrate processing unit 20 is connected to the rapid heat treatment (RTP) chamber 62 including an infrared lamp heat unit via a vacuum transfer path (a transfer chamber) 61. Referring to FIG. 3, the substrate processing unit 60 further includes a substrate loading/unloading module (a cassette chamber) 63 and a cooling module 64 which are connected to the vacuum transfer path 61.

Referring back to FIGS. 2(A) to 2(C), a number of island shaped protrusion defects are formed on the substrate surface in FIGS. 2(A) and 2(B), whereas there does not exist such defect at all in FIG. 2(C). Further, it seems that slight slants of [110] directions are formed on the surface of the silicon substrate 22 in the AFM image of FIG. 2(C), and two domains forming 2×1 atomic terrace and 1×2 atomic terrace are arranged alternately along slight slants to form a single atomic step. It has been known that silicon atoms of the surface of reconstructed silicon (100) form a dimer row in the 2×1 atomic terrace and the 1×2 atomic terrace. Since silicon atom dimer rows of neighboring terraces are perpendicular to each other, the step line is straight or zigzag depending on the energy of an edge of the step.

As a result of measuring the surface roughness, it is found that average surface roughnesses Rms are 2.09 nm and 1.27 nm, and maximum irregular amplitudes PV are 16.1 nm and 11.7 nm, respectively, in the samples of FIGS. 2(A) and 2(B). By comparison, in a sample of FIG. 2(C), an average surface roughness Rms is merely 0.113 nm, and a maximum irregular amplitude PV is reduced to 1.33 nm.

Figure 4:
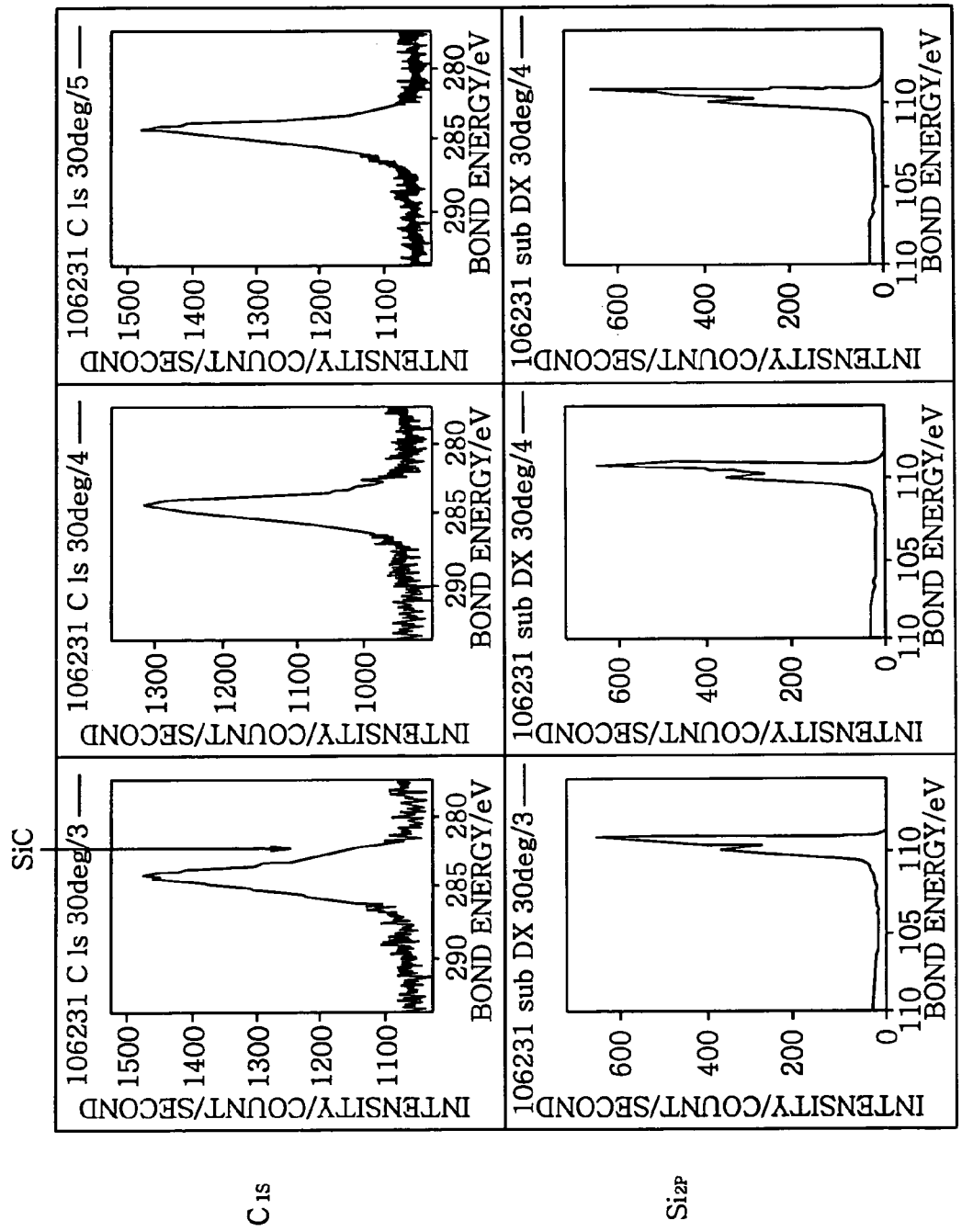

FIGS. 4(A) to 4(C) show the results of obtaining photoelectron spectrums from $C_{1s}$ orbit and $Si_{2p}$ orbit by the XPS analysis on the samples of FIGS. 2(A) to (C), respectively.

Referring to FIG. 4(A), a high peak of photoelectrons corresponding to $C_{1s}$ orbit is attributed to hydrocarbon in air, which is adsorbed on the substrate surface when the substrate is transferred to an analyzing unit. However, by partially overlapping in this peak, as shown with an arrow in FIG. 4(A), a chemical shift of $C_{1s}$ peak, which is generated by SiC bonding, is measured with eyes. The same chemical shift is produced in a spectrum in FIG. 4(B), but the spectrum of FIG. 4(C) corresponding to the sample of FIG. 2(C) is sharp, and it can be found that SiC bonding is not formed in the sample of FIG. 2(C).

From the above fact, it can be concluded that the island shaped protrusion defects shown in FIGS. 2(A) and 2(B) are SiC. It is deemed that carbon atoms originated from organic substance such as hydrocarbon in the air, which is adsorbed to the surface of silicon substrate, react with silicon atoms in the silicon substrate during the heat treatment to form the SiC.

FIGS. 2(A) to 2(C) show that surface roughness of the substrate gets worse rapidly when there are the SiC defects on the surface of the silicon substrate. In fact, it is illustrated that the SiC defects pin the silicon atoms on the surface of silicon substrate to thereby prevent the silicon atoms from moving along the surface, and by removing the SiC defects, the silicon atoms can move freely even under a condition of temperature and pressure used in a usual semiconductor process to form an atomic layer step.

The above result proves removing carbon compounds by using ultraviolet irradiation in nitrogen has an effect preferable to that in oxygen. Conventionally, in order to remove adsorbed carbon compounds, it has been considered a method of removing the carbon compounds on the surface by oxidizing organic substance by radical oxide species and the like to thereby form $CO_2$ and/or $H_2O$. The present experiment suggests that carbon may not be completely separated from the surface depending on a reaction between organic substance and oxide species. Since the oxide species oxidize the silicon surface, it is expected that a portion of carbon compounds generated by oxidation is included in the silicon oxide film and left therein. On the other hand, in case of irradiating an ultraviolet light in nitrogen, it is regarded that large organic molecules are decomposed into small molecules by ultraviolet energy and effectively separated from the silicon surface by heating in a depressurized atmosphere. At this time, it is important that partial pressure of oxygen is decreased sufficiently in an atmosphere where the silicon substrate is processed such that the silicon substrate is not oxidized.

Figure 5:
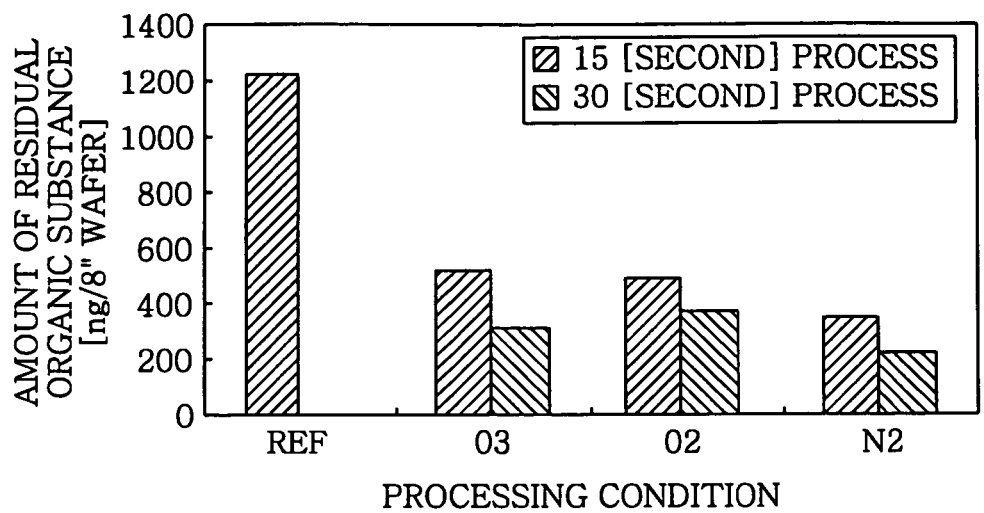
FIG. 5 is a graph showing an effect of removing carbon from a surface of the silicon substrate by various processes.

FIG. 5 provides effects of removing carbon from the surface of silicon substrate by using various processes, wherein the effects are presented in terms of the result obtained by the GCMass spectrum. Referring to FIG. 5, when a carbon removing process is not performed, organic substance of about 1200 ng is adhered to the surface of the silicon substrate having 8 inch diameter, and fractions of it can be removed by a process using ozone, oxygen, or nitrogen. Among them, a process using nitrogen is the most effective and amount of residual organic substance is reduced to about 350 ng by 15 second process and to about 200 ng by 30 second process. The following Table 1 represents a variety of bond energies of carbon.

TABLE 1

| chemical bond | wavelength (nm) |
|---|---|
| C=N | about 150 |
| C=O | 160 |
| C=C | 200 |
| C—F | 270 |

TABLE 1-continued

| chemical bond | wavelength (nm) |
|---|---|
| C—H | 300 |
| C—C | 330 |
| C—O | 350 |
| C—Cl | 400 |
| C—N | 440 |
| C—Br | 470 |

Referring to Table 1, as described above, in the substrate processing unit 20 of FIG. 1, almost all carbon bonds except C═N and C═O bonds can be broken by using an ultraviolet source having 172 nm wavelength as the ultraviolet source 24B. In case of using a mercury lamp of 245 nm wavelength, it is possible to obtain energy sufficient to break all carbon bonds except double bonds. By irradiating an ultraviolet light of a wavelength being about 270 nm or less, hydrocarbon-based high molecular weight adsorbed material which is adhere to the surface of the silicon substrate can be converted into low molecular weight material to thereby promote separation from the substrate surface.

Figure 6:
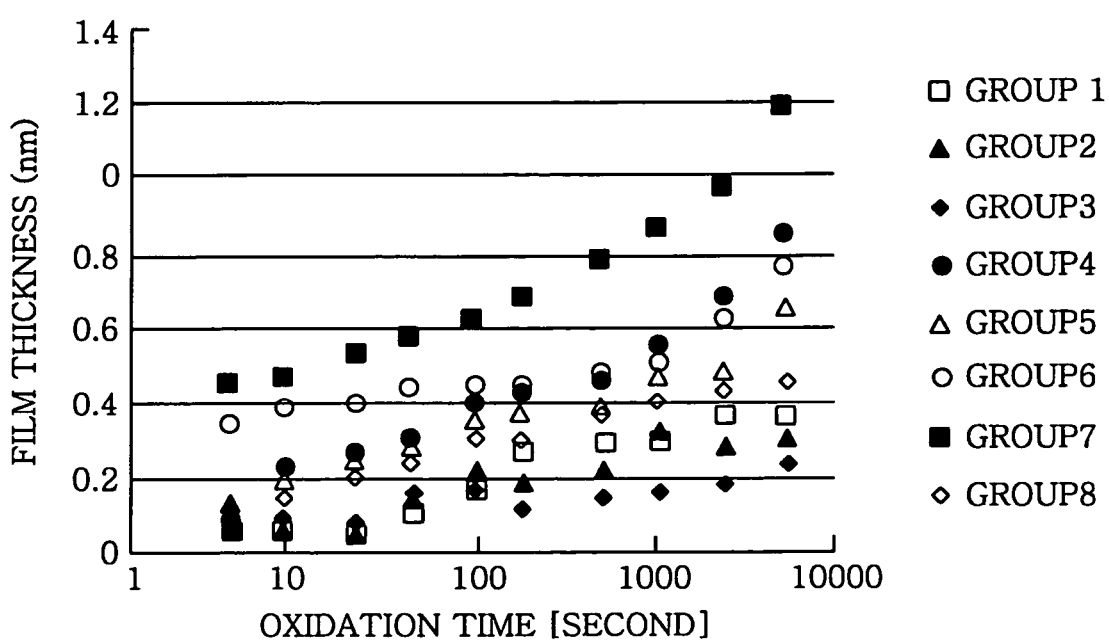
FIG. 6 is a graph showing a relation between a film thickness and an oxidation time when performing the substrate processing method in accordance with embodiments of the present invention.

FIG. 6 shows a relation between a film thickness and oxidation time in case that a silicon oxide film is formed on the surface of the silicon substrate 22 by using UV radical substrate processing unit 20 while setting the substrate temperature at 450° C.; supplying an oxygen gas to the shower head 21B; and varying irradiation intensity of an ultraviolet light, a flow rate of the oxygen gas and a partial pressure of oxygen. However, in the experiment shown in FIG. 2, a native oxide film was removed from the surface of the silicon substrate 22 before a radical oxidation and further carbon compounds remaining on the substrate surface were removed by decomposition reaction by using an ultraviolet light depending on circumstances. Further, the substrate surface was planarized by using a high-temperature heat treatment at about 950° C. in Ar atmosphere. Furthermore, an excimer lamp of 172 nm wavelength is used as the ultraviolet source 24B.

Referring to FIG. 6, data of group 1 show a relation between the film thickness and the oxidation time in case of setting an irradiation intensity of the ultraviolet light to be 5% of a reference intensity (50 mW/cm$^2$) in a window surface of the ultraviolet source 24B; a processing pressure to be 665 mPa (5 mTorr); and a flow rate of an oxygen gas to be 30 SCCM, and data of group 2 show a relation between the film thickness and the oxidation time in case of setting the intensity of the ultraviolet light to be zero; the processing pressure to be 133 Pa (1 Torr); and the flow rate of the oxygen gas to be 3 SLM. Further, data of group 3 show a relation between the film thickness and the oxidation time in case of setting the intensity of the ultraviolet light to be zero; the processing pressure to be 2.66 Pa (20 mTorr); and the flow rate of the oxygen gas to be 150 SCCM, and data of group 4 show a relation between the film thickness and the oxidation time in case of setting the intensity of the ultraviolet light to be 100%, that is, the reference intensity; the processing pressure to be 2.66 Pa (20 mTorr); and the flow rate of the oxygen gas to be 150 SCCM. Furthermore, data of group 5 show a relation between the film thickness and the oxidation time in case of setting the irradiation intensity of the ultraviolet light to be 20% of the reference intensity; the processing pressure to be 2.66 Pa (20 mTorr); and the flow rate of the oxygen gas to be 150 SCCM, and data of group 6 show a relation between the film thickness and the oxidation time in case of setting the irradiation intensity of the ultraviolet light to be 20% of the reference intensity; the processing pressure to be 67 Pa (0.5 Torr); and the flow rate of the oxygen gas to be 0.5 SLM. Moreover, data of group 7 show a relation between the film thickness and the oxidation time in case of setting the irradiation intensity of the ultraviolet light to be 20% of the reference intensity; the processing pressure to be 665 Pa (5 Torr); and the flow rate of the oxygen gas to be 2 SLM, and data of group 8 show a relation between the film thickness and the oxidation time in case of setting the irradiation intensity of the ultraviolet light to be 5% of the reference intensity; the processing pressure to be 2.66 Pa (20 mTorr); and the flow rate of the oxygen gas to be 150 SCCM. In the experiment of FIG. 6, the thickness of the oxide film was obtained by the XPS method, but there is not a universal method for finding the thickness of an extremely thin oxide film less than 1 nm at present.

Figure 7:
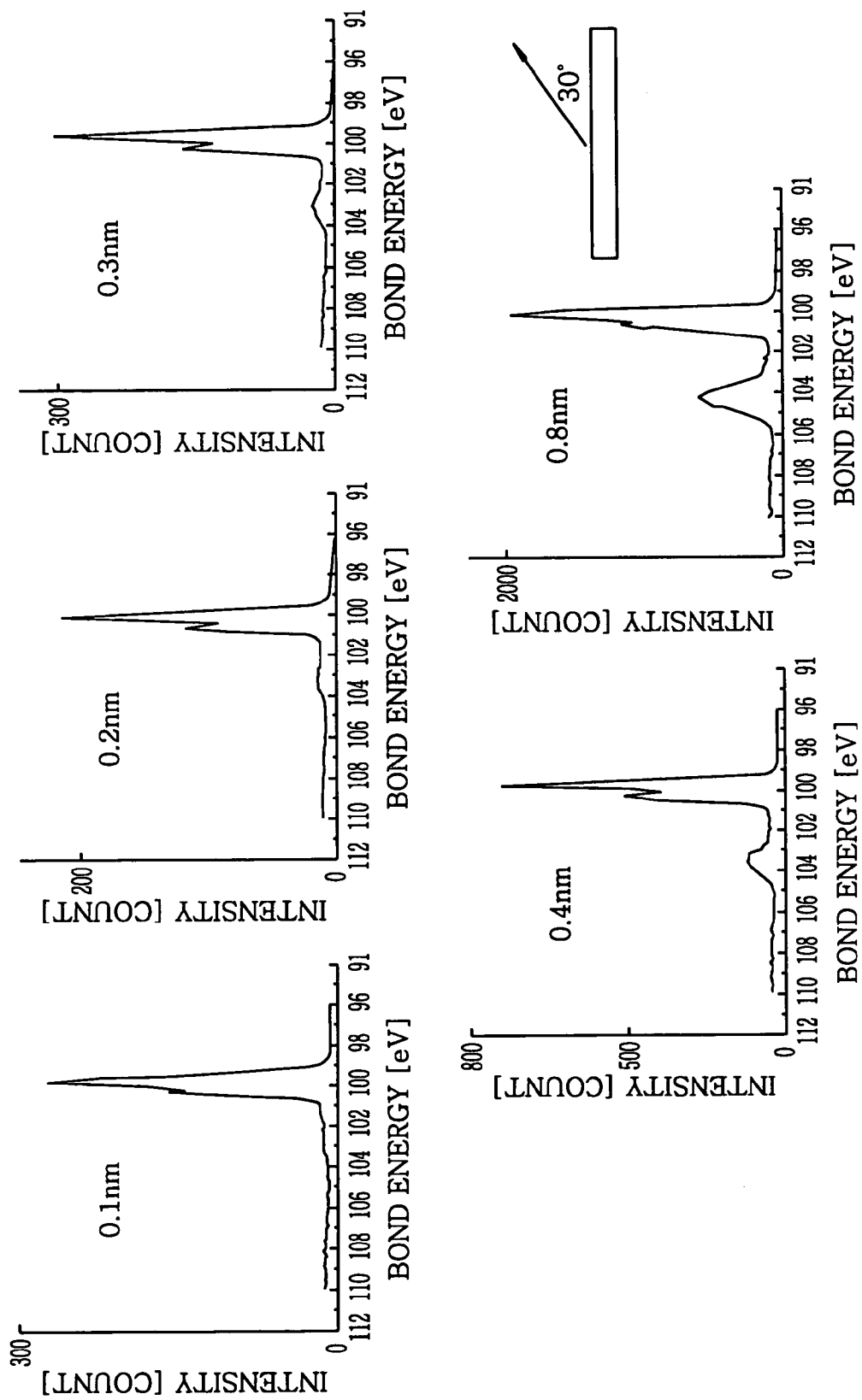
FIG. 7 is a diagram for explaining the determination of a film thickness by an XPS method used in the present invention.

Therefore, the inventors of the present invention calculate a thickness d of an oxide film by using Eq. (1) and a coefficient according to teaching of Lu, et al. (Z. H. Lu, et. al.; Appl. Phys. Lett. 71(19), Nov. 10, 1997, pp. 2764–2766) based on $Si_{2p}{}^{3/2}$XPS spectrum shown in FIG. 8, which is obtained by performing background compensation and separating compensation of 3/2 spin state and 1/2 spin state for the XPS spectrum of from the measured $Si_{2p}$ orbit shown in FIG. 7.

$$d = \lambda \sin \alpha \cdot \ln[I^{X+}/(\beta I^{0+})+1] \qquad \text{Eq. (1)}$$

$$\lambda = 2.96$$

$$\beta = 0.75$$

wherein α is a detection angle of an XPS spectrum and is set to be 30° in the illustrated example. Further, $I^{X+}$ in the Eq. (1) is an integral intensity ($I^{1+}+I^{2+}+I^{3+}+I^{4+}$) of the spectrum peak corresponding to the oxide film, which corresponds to a peak in an energy range from 102 to 104 eV. On the other hand, $I^{1+}$ corresponds to an integral intensity of a spectrum peak due to the silicon substrate, corresponding to an energy range of around 100 eV.

Figure 9:
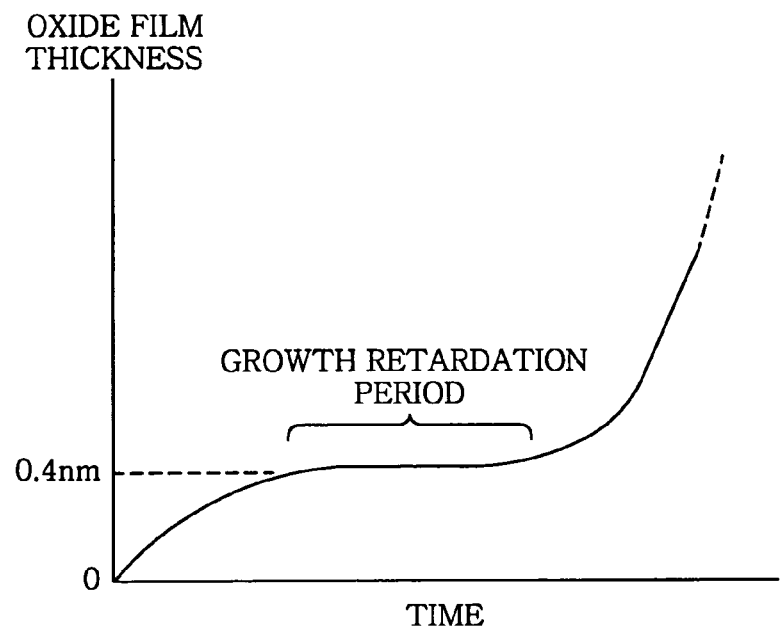
FIG. 9 shows a stoppage occurring when oxidizing the surface of the silicon substrate by using the substrate processing unit shown in FIG. 1.

Referring back to FIG. 6, in groups 1, 2, 3 and 8, where an irradiation power of the ultraviolet light and an oxygen radical density according thereto are small, the thickness of the oxide film was 0 nm at first and then continued to increase gradually along with the oxidation time, whereas in groups 4, 5, 6 and 7, where the irradiation power of the ultraviolet light was designed to be equal to or more than 20% of the reference intensity, as schematically shown in FIG. 9, an oxide film stopped to grow at about 0.4 nm film thickness after start of the growth and then resumed the growth rapidly after a growth retardation period passed.

From FIG. 6 or 9, in oxidizing the surface of the silicon substrate, an extremely thin oxide film having a thickness of around 0.4 nm can be formed stably.

Further, as shown in FIG. 6, an oxide film formed during the growth retardation period persesting or spanning a certain amount of time has a constant thickness. Namely, in accordance with the present invention, it is possible to form an oxide film having a constant thickness of about 0.4 nm on the silicon substrate.

Figure 10A:
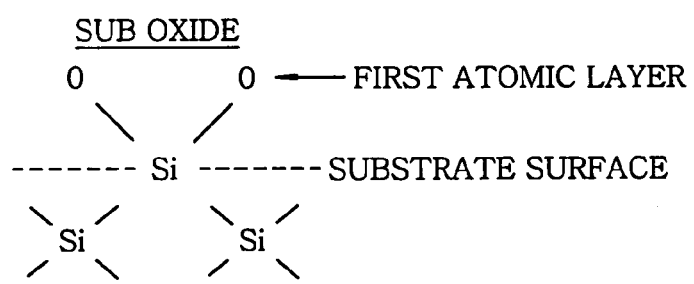
FIGS. 10(A) and 10(B) schematically set forth the surface of the silicon substrate which is oxidized by the substrate processing unit shown in FIG. 1.
Figure 10B:
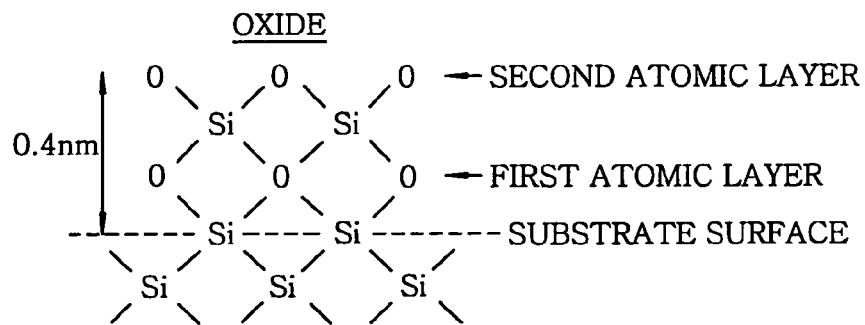

FIGS. 10(A) and 10(B) schematically set forth a process of forming a thin oxide film on the silicon substrate. It should be noted that the structure on the silicon (100) substrate was simplified exceedingly in FIGS. 10(A) and 10(B).

Referring to FIG. 10(A), formed on the surface of the silicon substrate is an oxygen layer of a single atomic layer by bonding two oxygen atoms to one silicon atom. In the typical state, a silicon atom on the substrate surface is coordinated by two silicon atoms inside the substrate and two oxygen atoms outside the substrate, thereby forming suboxide.

By comparison, in a state shown in FIG. 10(B), a silicon atom at a top portion of the silicon substrate is coordinated by four oxygen atoms, assuming a stable state of $Si^{4+}$. Consequently, it is deemed that the oxidation proceeds quickly in the state shown in FIG. 10(A) and then the oxidation stops in the state of FIG. 10(B). The oxide film thickness in the state shown in FIG. 10(B) is approximately 0.4 nm and coincides with the oxide film thickness observed in the growth retardation state shown in FIG. 6.

Figure 8:
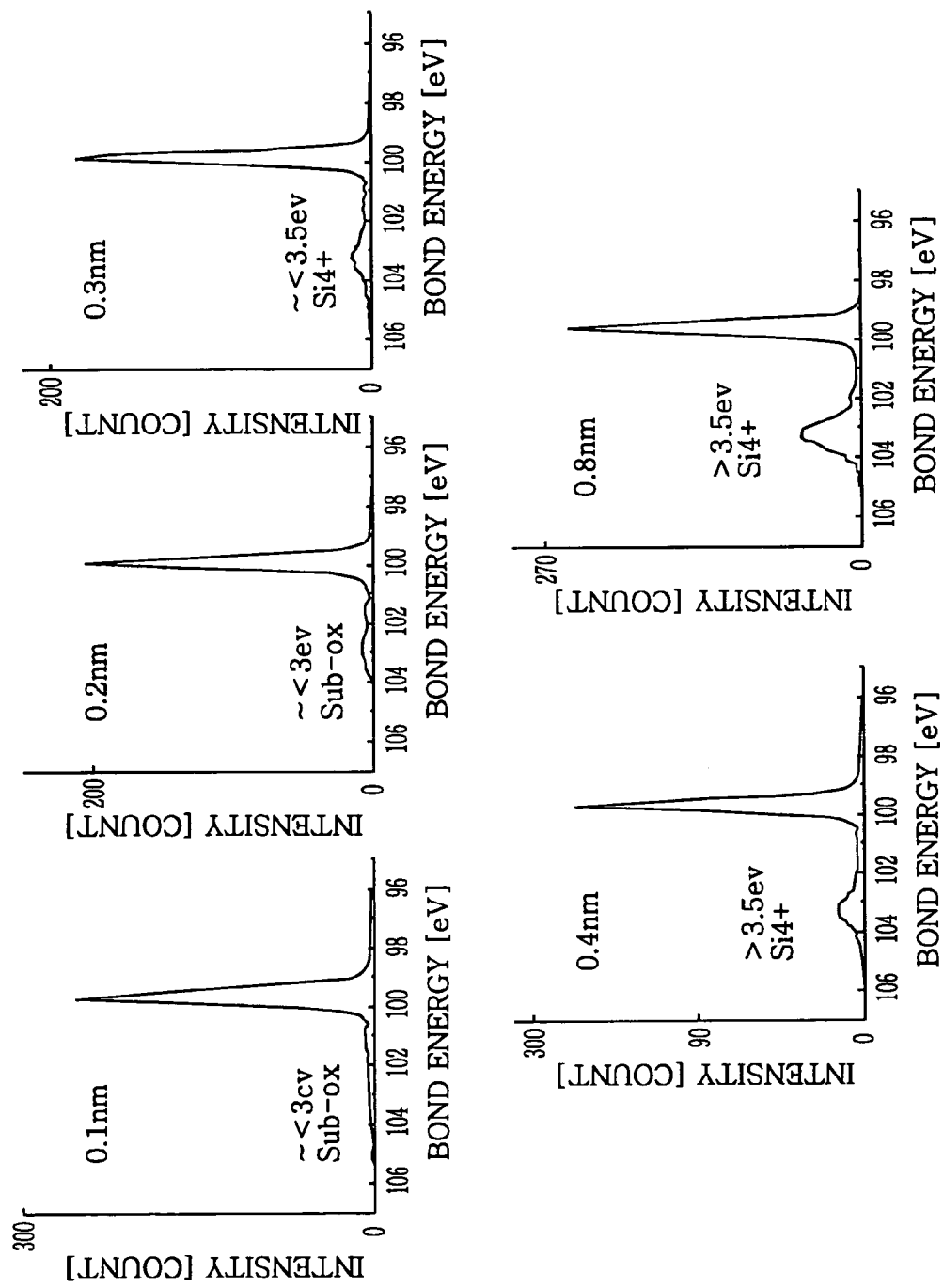
FIG. 8 is another diagram for explaining the determination of a film thickness by the XPS method used in the present invention.

In the XPS spectrum of FIG. 8, a low peak in the energy range from 101 to 103 eV corresponds to the suboxide shown in FIG. 10 in case the oxide film thickness is 0.1 nm or 0.2 nm, and a peak in the energy range is attributed to $Si^{4+}$ and represents formation of an oxide film having more than one atomic layer in case the oxide film thickness is larger than 0.3 nm.

Resuming the oxidation in the state shown in FIG. 10(B), the oxide film thickness is increased again.

FIG. 11(A) offers a film thickness distribution obtained by an ellipsometer in case that a 0.4 nm thick oxide film thus formed on the silicon substrate continues to be oxynitride by supplying NO gas to the shower head 21B in the substrate processing unit 20 shown in FIG. 1. Further, the following Table 2 provides actual film thicknesses in a central portion and a peripheral portion of the substrate of FIG. 11(A), which were obtained by using the above-described XPS method and setting a detection angle at 90°. The oxynitriding was performed while supplying NO gas to the shower head 21B at the flow rate of 200 SCCM, keeping the internal pressure of the processing chamber 21 to be 3.99 Pa (0.03 Torr) and operating the ultraviolet source 24B with the above reference intensity for 3 minutes. The substrate temperature was set at 450° C.

TABLE 2

|  | 90° center | 90° periphery |
|---|---|---|
| $Si^{0+}$ | 89.45 | 88.13 |
| $Si^{4+}$ | 10.55 | 11.87 |
| $Si^{4+}/Si^{0+}$ | 0.117943 | 0.134687 |
| film thickness (nm) | 0.43 | 0.49 |

Referring to FIG. 11(A) and Table 2, the film thickness after the oxynitriding ranged from 0.43 to 0.49 nm in a central portion and a peripheral portion of the substrate, and hardly departed from the film thickness of about 0.4 nm at the beginning. Further, for the thus processed oxide film, detection of nitrogen was attempted by using the XPS analysis, but a signal was not detected from the nitrogen atom. This means that nitriding of the oxide film does not proceed at all in oxynitriding.

FIG. 11(B) presents the film thickness distribution after the oxynitriding, which was obtained by an ellipsometer, in case that a 0.7 nm thick oxide film was formed on the silicon substrate under the same condition. Further, the following Table 3 provides actual film thicknesses in a central portion and a peripheral portion of the substrate, which were obtained by using the XPS method and setting a detection angle at 90°.

TABLE 3

|  | 90° center | 90° periphery |
|---|---|---|
| $Si^{0+}$ | 83.49 | 88.88 |
| $Si^{4+}$ | 16.51 | 16.12 |
| $Si^{4+}/Si^{0+}$ | 0.197748 | 0.192179 |
| film thickness (nm) | 0.69 | 0.68 |

Referring to FIG. 11(B) and Table 3, also in this case, the film thickness after the oxynitriding ranged from 0.69 to 0.68 nm in a central portion and a peripheral portion of the substrate, and hardly departed from the film thickness of about 0.7 nm at the beginning. Further, for the thus processed oxide film, detection of nitrogen was attempted by using the XPS analysis, but a signal was not detected from the nitrogen atom. From the results of Tables 2 and 3, it is realized that, in oxynitriding by UV radical NO process of the oxide film already formed on the surface of the silicon substrate, it is impossible to introduce nitrogen in the film though the thickness of the oxide film is small.

By comparison, FIG. 12(A) offers a film thickness distribution of a film formed on the surface of the silicon substrate 22, obtained by an ellipsometer, when directly performing UV radical-NO process on the silicon substrate without a native oxide film in the substrate processing unit 20 shown in FIG. 1. Further, Table 4 provides thicknesses of the film thus formed in a central portion and a peripheral portion of the substrate, which were obtained by using the XPS method and setting a detection angle at 90°. However, the experiment illustrated in FIG. 12(A) was performed while supplying NO gas to the shower head 21B at the flow rate of 200 SCCM in the substrate processing unit 20 shown in FIG. 1, keeping the internal pressure of the processing chamber 21 to be 3.99 Pa (0.03 Torr) as in the above case and operating the ultraviolet source 24B with the above reference intensity for 3 minutes. The substrate temperature was set at 450° C.

TABLE 4

|  | 90° Center | 90° periphery |  |
|---|---|---|---|
| $Si^{0+}$ | 86.81 | 86.92 |  |
|  |  |  | (0.03 Torr) |
| $Si^{4+}$ | 13.2 | 13.07 |  |
| $Si^{4+}/Si^{0+}$ | 0.152056 | 0.150368 |  |
| film thickness (nm) | 0.55 | 0.54 |  |

Referring to FIG. 12(A), a film having an almost uniform thickness was formed on the surface of the silicon substrate. The film thickness provided in Table 4 is approximately 0.5 nm in a central portion and a peripheral portion of the substrate.

Further, FIG. 12(B) presents a film thickness distribution, which was obtained by an ellipsometer, for a case that the oxynitriding was performed while setting NO gas at the flow rate of 1 SLM, maintaining the pressure of 665 Pa (5 Torr) and operating the ultraviolet source 24B with the above reference intensity for 1 minute. Further, for the film thus formed, the following Table 5 provides film thicknesses in a central portion and a peripheral portion of the substrate, which were measured by using the XPS method and setting a detection angle at 90°.

TABLE 5

|  | 90° center | 90° periphery | |
|---|---|---|---|
| $Si^{0+}$ | 87.78 | 87.57 | |
|  |  |  | (5 Torr) |
| $Si^{4+}$ | 12.22 | 12.42 | |
| $Si^{4+}/Si^{0+}$ | 0.139212 | 0.141829 | |
| film thickness (nm) | 0.50 | 0.51 | |

Referring to FIG. 12(B), also in this case, the film thickness distribution is almost uniform in the film formed on the surface of the silicon substrate. The film thickness provided in Table 5 is approximately 0.5 nm in a central portion and a peripheral portion of the substrate.

The following Table 6 provides the result obtained when performing element analysis for the film formed by the experiment of FIG. 12(A) by using the XPS method.

TABLE 6

| at % | center | | periphery | | |
|---|---|---|---|---|---|
|  | 90° | 30° | 90° | 30° | |
|  |  |  |  |  | (0.03 Torr) |
| $O_{1s}$ | 67.23 | 63 | 66.88 | 66.13 | |
| $N_{1s}$ | 11.18 | 10.19 | 9.13 | 9.63 | |
| $Si_{2p}$ | 21.59 | 26.81 | 23.99 | 24.23 | |

Referring to Table 6, in the film thus formed, a signal corresponding to $O_{1s}$ orbit, a signal corresponding to $N_{1s}$ orbit and a signal corresponding to $Si_{2p}$ orbit were observed. When setting a detection angle at 90°, it was confirmed that the concentration of an oxygen atom was 67.23%; the concentration of an nitrogen atom was 11.18%; and the concentration of an silicon atom was 21.59% in the central portion of the substrate. Further, in the peripheral portion of the substrate, it was measured that the concentration of an oxygen atom was 66.88%; the concentration of an nitrogen atom was 9.13%; and the concentration of an silicon atom was 23.99%.

Similarly, The following Table 7 provides the result obtained when performing element analysis for the film formed by the experiment of FIG. 12(B) by using the XPS method.

TABLE 7

| at % | center | | periphery | | |
|---|---|---|---|---|---|
|  | 90° | 30° | 90° | 30° | |
|  |  |  |  |  | (5 Torr) |
| $O_{1s}$ | 67.3 | 63.84 | 67.2 | 64.2 | |
| $N_{1s}$ | 11.66 | 10.36 | 11.44 | 10.43 | |
| $Si_{2p}$ | 21.04 | 25.8 | 21.37 | 25.36 | |

Referring to Table 7, also in the film thus formed, the signal corresponding to $O_{1s}$ orbit, the signal corresponding to $N_{1s}$ orbit and the signal corresponding to $Si_{2p}$ orbit were observed. When setting a detection angle at 90°, it was measured that the concentration of an oxygen atom was 67.3%; the concentration of an nitrogen atom was 11.66%; and the concentration of an silicon atom was 21.04% in the central portion of the substrate. Further, in the peripheral portion of the substrate, it was measured that the concentration of an oxygen atom was 67.2%; the concentration of a nitrogen atom was 11.44%; and the concentration of an silicon atom was 21.37% and it was recognized that composition of the film was more uniform than the case of Table 6. That is, also in this case, the oxynitride film having a uniform composition was formed on the surface of the silicon substrate.

However, the Table 7 shows that the nitrogen concentrations in both the central portion and the peripheral portion in the measurement performed while setting the detection angle of XPS spectrum at 30° were slightly decreased compared with the measurement performed while setting the detection angle at 90°. In case of measurement using a small detection angle, the signal by the photoelectrons emitted from the lower portion of the oxynitride film was attenuated when obliquely passing through the film and, thus, it is deemed that composition of an upper portion of the film was mainly detected. Therefore, in the oxynitride film thus formed, Table 7 shows that the nitrogen atoms were comparatively concentrated in proximity to an interface between the oxynitride film and the silicon substrate. A similar tendency is seen in analysis results of the central portion of the substrate in Table 6.

Next, there will be described kinetics of oxynitride film formation on the surface of the silicon substrate by UV-NO process.

Figure 13A:
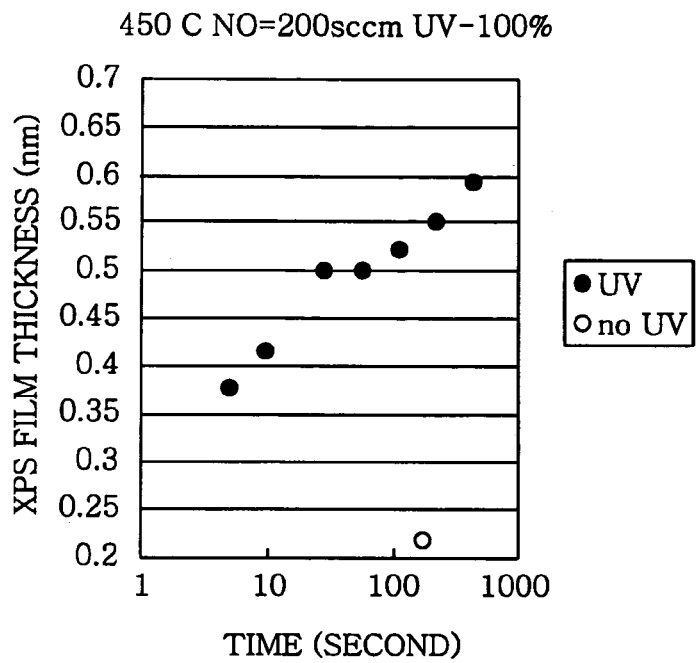
FIGS. 13(A) and 13(B) represent diagrams showing kinetics of oxynitride film forming on the surface of the silicon substrate by UV-NO nitriding in accordance with the first embodiment of the present invention.
Figure 13B:
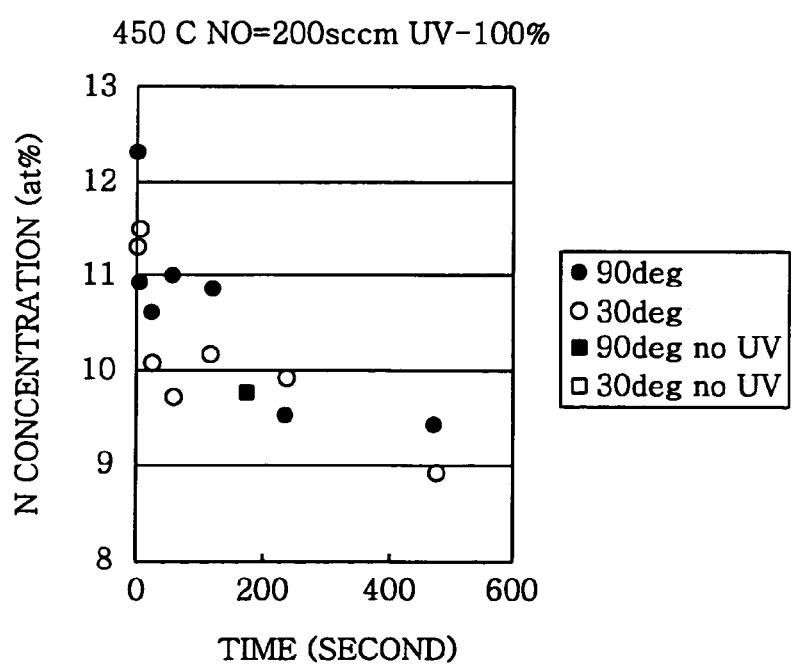

FIGS. 13(A) and 13(B) represent thicknesses of an oxynitride film and N concentrations in the film when varying the operating time while supplying NO gas to the shower head 21B at the flow rate of 200 SCCM; keeping a processing pressure to be 3.99 Pa (30 mTorr); and operating the ultraviolet source 24B with the above reference intensity at 450° C. in the substrate processing unit 20 shown in FIG. 1.

Referring to FIG. 13(A), the thickness of the oxynitride film is increased as time goes by, but when the film thickness reaches about 0.5 nm, the film growth stops as previously described in FIGS. 6 and 9. Further, FIG. 13(A) also shows a case where the ultraviolet source 24B was not operated in nitriding.

In this case, the growth of the oxynitride film did not occur as shown in FIG. 13(A).

On the other hand, FIG. 13(B) shows that the nitrogen concentrations when setting the detection angle of XPS analysis at 30° were smaller than ones when setting the detection angle at 90° right after oxynitriding, and nitrogen was concentrated in proximity to an interface between the oxynitride film and the silicon substrate. Further, from FIG. 13(B), it is found that non-uniformity in a nitrogen distribution in a film thickness direction was resolved gradually by continuing oxynitriding.

FIG. 13(B) shows that an oxynitride film having a high nitrogen concentration was formed right after beginning of the nitriding; and the nitrogen concentration in the film was decreased as time passed and the film growth mechanism shifted to mainly an oxidation reaction process. The problem of non-uniformity of the nitrogen concentration in the film thickness direction was resolved after about 200 seconds passed from the beginning of the process.

Figure 14A:
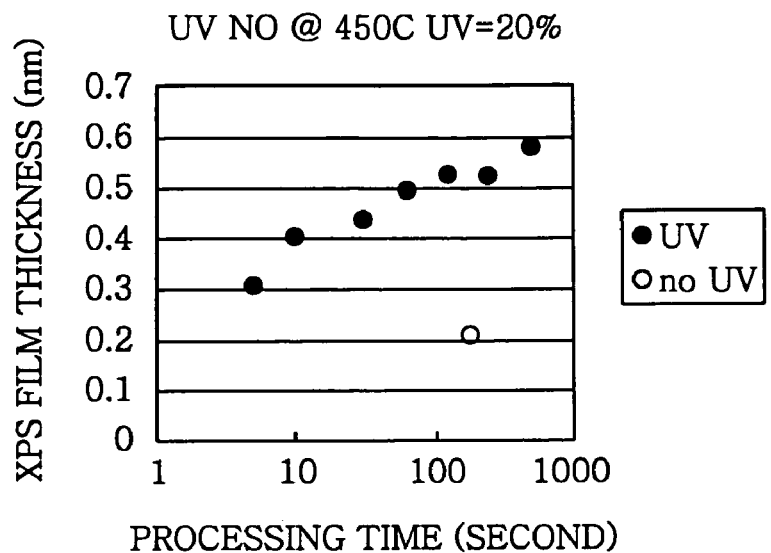
FIGS. 14(A) and 14(B) present another diagrams showing kinetics of oxynitride film forming on the surface of the silicon substrate by UV-NO nitriding in accordance with the first embodiment of the present invention.
Figure 14B:
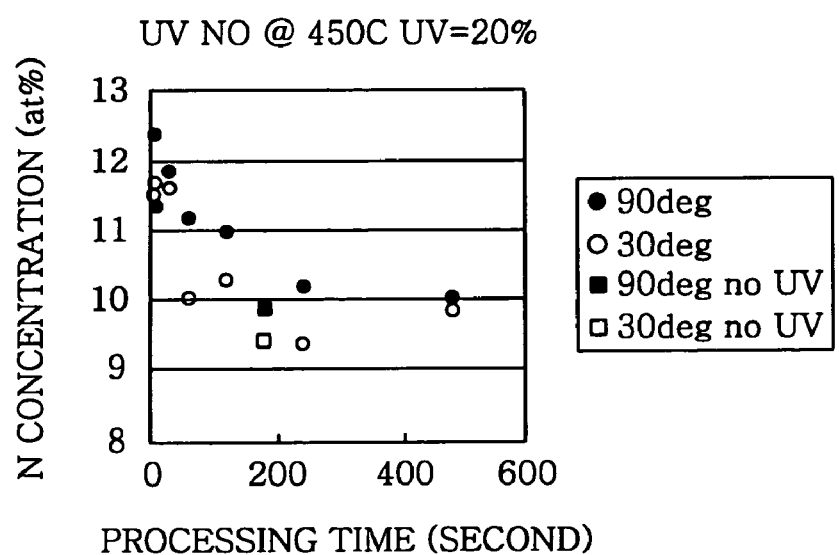

FIGS. 14(A) and 14(B), respectively corresponding to FIGS. 13(A) and 13(B), represent cases where the oxynitriding was performed while setting an operating power of the Ultraviolet source 24B to be 20% of the reference intensity, but show the same result as obtained in the cases of FIGS. 13(A) and 13(B). That is, that the film growth stopped when the film thickness became about 0.5 nm and, further, at the beginning of the film growth, an oxynitride film having a high nitrogen concentration was formed, whereby the nitrogen atoms were concentrated in proximity to the interface between the oxynitride film and the silicon substrate.

Figure 15A:
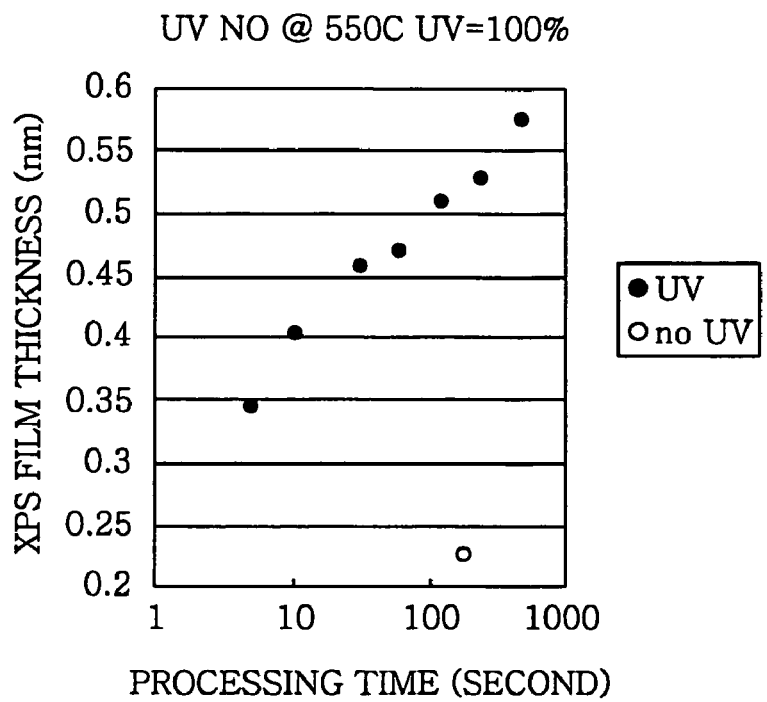
FIGS. 15(A) and 15(B) present still another diagrams showing kinetics of oxynitride film forming on the surface of the silicon substrate by UV-NO nitriding in accordance with the first embodiment of the present invention.
Figure 15B:
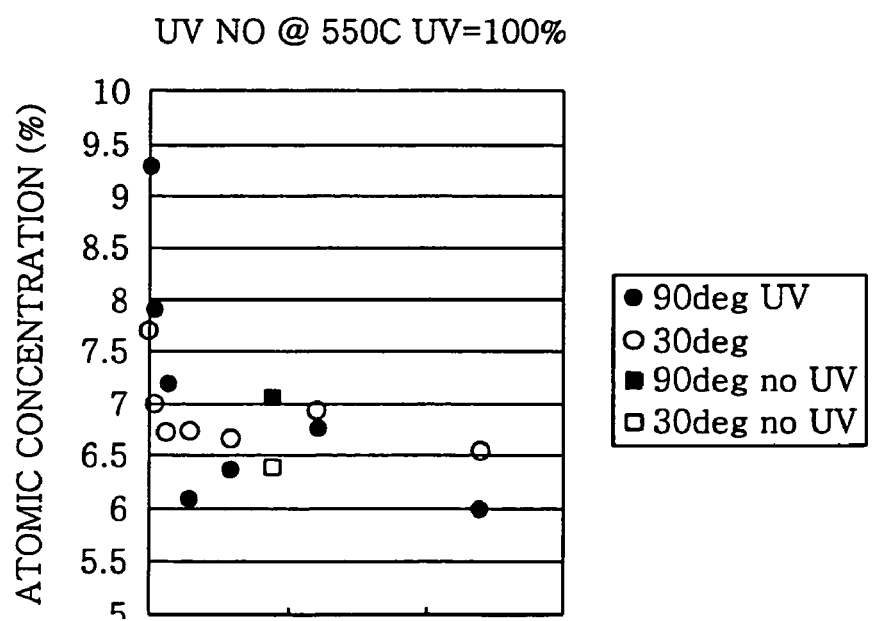

By comparison, FIGS. 15(A) and 15(B) represent the relation between the film thickness and the processing time in case the identical oxynitriding performed on the surface of the silicon substrate while setting the substrate temperature at 550° C. and the relation between the distribution of the nitrogen concentration in the film and the processing time.

First, referring to FIG. 15(B), whether a detection angle in XPS analysis was set at 90° or at 30°, the concentration of the nitrogen atoms in the film was substantially lower than that of the case of FIG. 13(B) or 14(B) and, thus, the formed oxynitride film should have a composition which was close to that of an oxide film. It is considered that oxidation was promoted by oxygen remaining in the processing chamber 21 due to a substrate temperature set at 550° C. in oxynitriding.

Further, since the oxynitride film formed as depicted in FIG. 15(A) has a composition which is close to that of an oxide film, it is deemed that the film growth stopped when the film thickness reached around 0.46 nm, closer to 0.4 nm in the case of FIGS. 6 and 9.

Furthermore, in the present invention, the thickness of the oxynitride film is obtained by using the above-described Eq. (1) and accompanying parameters thereof. However, since the Eq. (1) is derived for the oxdie film, the thickness of the oxynitride film may be overestimated due to the effect of a photoelectron escape depth. Whatever case, it is considered that the oxide film formed in accordance with the present invention was controlled to have a film thickness of approximately two atomic layers.

Hereinafter, there will be described the selection of the ultraviolet source 24B in case that the substrate processing unit 20 shown in FIG. 1 is employed in the oxynitriding of the silicon substrate.

Figure 16:
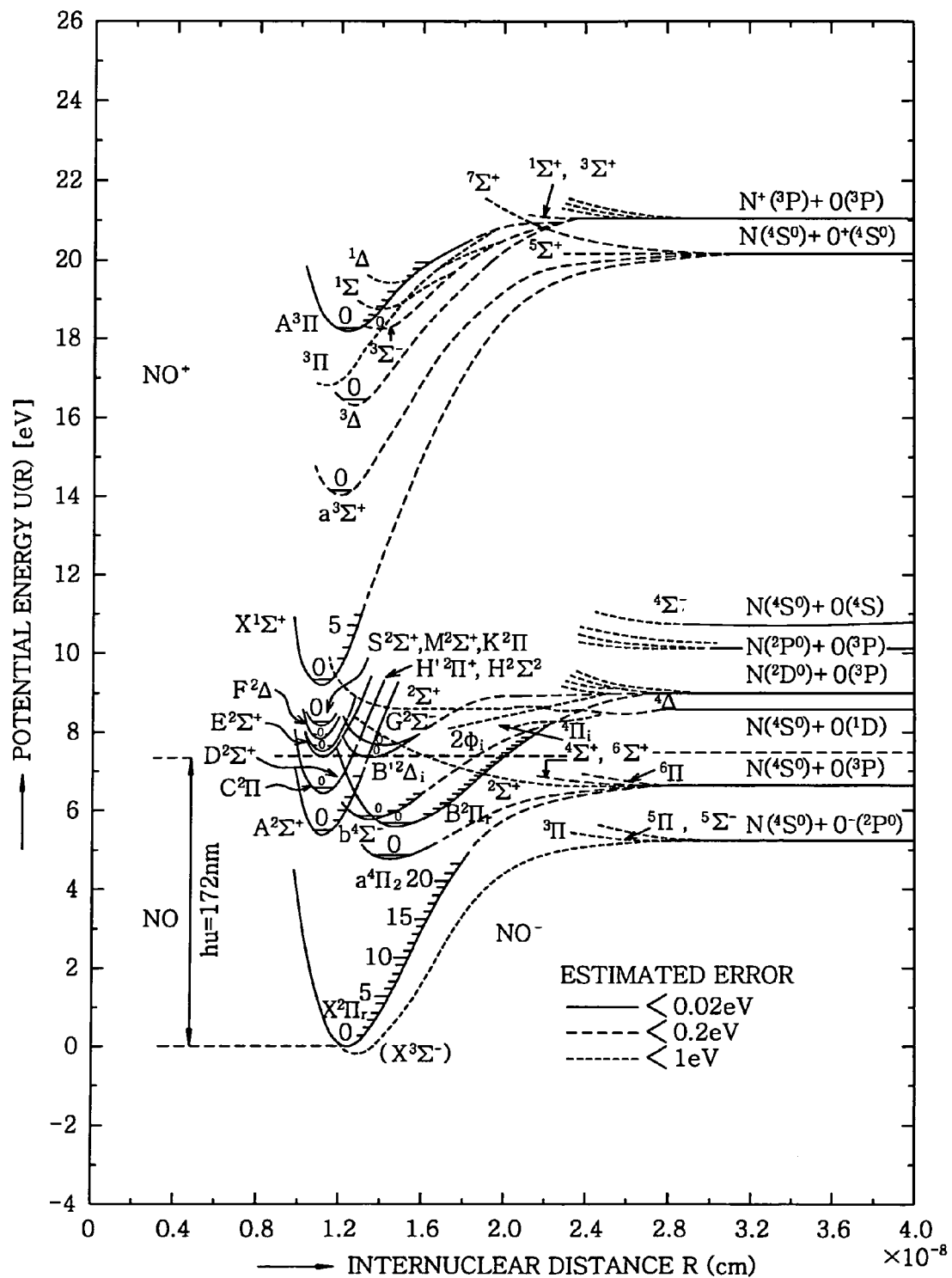
FIG. 16 illustrates potential curves in various excited states of NO molecules.

FIG. 16 shows potential curves in various excited states of NO molecules. (For example, refer to "Atomic and Molecular Processes in Ionised Gases", written by J. S. Chang, R. M. Hobson, M. Ichikawa and T. Kaneda, published by Tokyo Denki University Press in 1982.)

In an optical transition of NO molecules by the ultraviolet light, the existence of an absorption band in accordance with the transition from a ground state to excited states, i.e., $A^2\Sigma^+$, $B^2\Pi r$, $C^2\Pi$, $D^2\Sigma^+$ and $E^2\Sigma^+$, is known, wherein the transitions can occur by using light wavelengths greater than or equal to 227 nm, 218 nm, 192 nm, 188 nm, and 165 nm, respectively. Meanwhile, FIG. 16 shows atom shaped oxygen ($O_{3p}$) and atom shaped nitrogen ($N_{4S}^0$) can be excited in a wavelength range from 192 nm to 145 nm.

That is, NO molecules are deexcited with light having a wavelength of 145 nm or less, whereby it is possible to generate the atom shaped oxygen and the atom shaped nitrogen. On the other hand, it is deemed that since radical oxygen ($O_{1D}$) begins to be excited when a wavelength of light becomes shorter than 145 nm, oxidation reaction becomes main process in processing the substrate.

From the above fact, it is preferable to use a light source capable of generating an ultraviolet light whose wavelength falls within the range from 192 to 145 nm for the ultraviolet source 24B in order to an oxynitride film on the surface of the silicon substrate in the substrate processing unit 20 shown in FIG. 1.

Since the substrate processing unit 20 shown in FIG. 1 is employed in a single wafer semiconductor manufacturing process, it is preferable that the light source 24B can be turned on or off occasionally. Presently, for the ultraviolet source which can be turned on or off occasionally and has a sharp spectrum, an excimer lamp of 308 nm, 222 nm, 172 nm, 146 nm or 126 nm wavelength is commercially available. Among them, only an excimer lamp of 172 nm or 146 nm wavelength satisfies the above condition. The excimer lamp of 146 nm wavelength has a full width at half maximum of about 13 nm, whereby a part of spectrum becomes 145 nm or less and excitation of oxygen radical may be generated depending on the state of the lamp or individual difference. Accordingly, in case an excimer lamp on the market is used as the ultraviolet source 24B in the substrate processing unit 20 shown in FIG. 1, one of 172 nm wavelength is preferably used.

Figure 17:
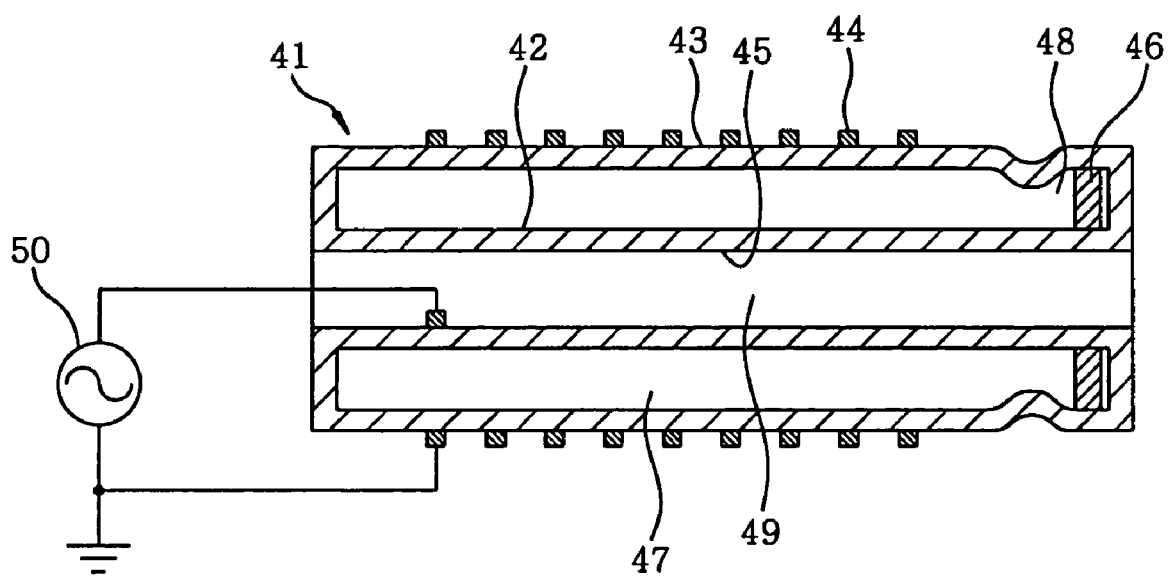
FIG. 17 depicts an example of the ultraviolet source.

FIG. 17 shows a schematic configuration of an excimer lamp (dielectric barrier discharge tube) 41 for generating an ultraviolet light of such 172 nm (see Japanese Patent Laid-open Application No. H7-196303 or Japanese Patent Laid-open Application No. H8-85861).

Referring to FIG. 17, the excimer lamp 41 includes a double cylindrical container having an inner tube 42 and an outer tube 43, wherein a sealed space 47 between the inner quartz tube 42 and the outer quartz tube 43 is filled with Xe gas at a pressure of 33.25 kPa (250 Torr). Further, an aluminum thin film electrode 45 is formed on an inner surface of the inner quartz tube 42 and a mesh electrode 44 is formed on an outer surface of the outer quartz tube 43. Furthermore, a getter chamber 48 is formed at an axial end portion of the space 47 and a getter 46 is disposed in the getter chamber 48. By applying AC voltage between the electrode 44 and the electrode 45 by a power supply 50, lighting controls of the excimer lamp 41 are possible.

UER20-172 manufactured by Ushio Electric Co. or HES1703S manufactured by Hoya-Schott Co. can be used as the excimer lamp. The ultraviolet source is not limited to the above-mentioned excimer lamp and can be a low-pressure mercury lamp or an excimer laser depending circumstances.

Figure 21:
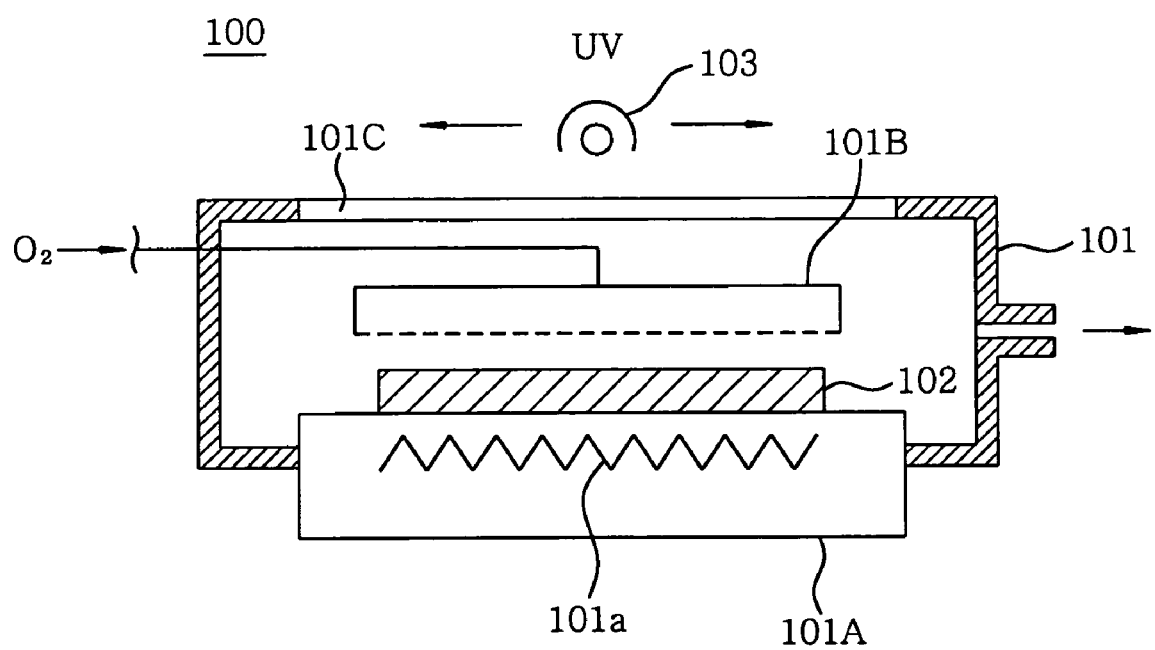
FIG. 21 describes a vertical sectional view showing a configuration of a conventional UV-$O_2$ oxidizing apparatus.

Hereinafter, in a NO gas process under the ultraviolet irradiation, FIGS. 21(A) and 21(B) provide nitrogen concentrations in the film measured by XPS at detection angles of 90° and 30°, and the ratio (30°/90°) of measured values at a detection angle of 90° to measured values at a detection angle of 30°, respectively. In this experiment, the silicon substrate supported in the evacuated cassette chamber (reference numeral 63 of FIG. 3) was conveyed to a reaction chamber 20 through the transfer chamber 61 varying the supporting time and then oxynitrided by UV-NO.

Figure 20A:
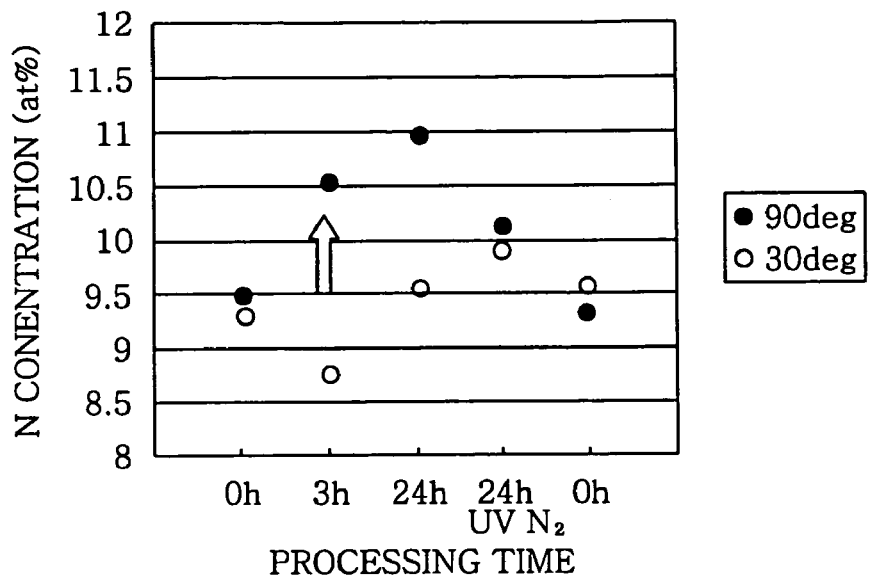
FIG. 20 sets forth graphs illustrating nitrogen concentrations in the film measured by XPS at detection angles of 90° and 30° and the ratio (30°/90°) of measured values at a detection angle of 90° to measured values at a detection angle of 30°.
Figure 20B:
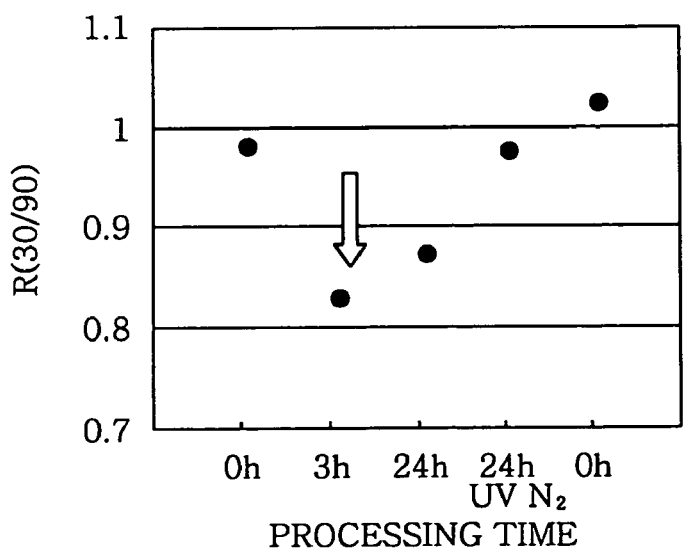

Since a cassette elevating mechanism and the like were installed in the evacuated cassette chamber, organic elements emitted from such machinery could contaminate the silicon substrate supported for a long time. FIG. 20 apparently shows that a wafer, i.e., silicon substrate, on which a film was formed right after loading thereof had an increased N concentration and a decreased ratio (30°/90°) compared with a wafer on which a film was formed while supported in the cassette chamber for 3 to 24 hours. As described above, film forming characteristics are changed while the wafer is supported in the cassette chamber, which has an immense effect on a device manufacturing process. In particular, in the oxynitride film having a small ratio (30°/90°), nitrogen tends to reside inside the film, so that segregation can be caused at an interface. The above characteristic is regarded having a great effect on an interface characteristic of a gate insulating film and thus it is required to stably provide identical characteristics in the process. Typically, when processing a lot of multiple wafers, 2 to 3 hours of supporting time would be needed.

However, even a wafer contaminated by holding for 24 hours, as shown in FIG. 20, when performing UV-NO oxynitriding after UV-N$_2$ process, both concentration and ratio (30°/90°) return to values close to those plotted in the silicon substrate having no holding time. The reason is speculated that adsorbed organic molecules are removed in the process.

Second Embodiment

Figure 18A:
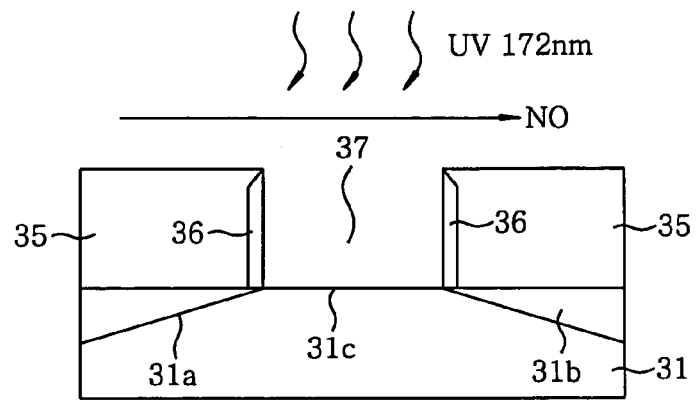
FIGS. 18(A) to 18(C) describe a process of manufacturing a semiconductor device in accordance with a second embodiment of the present invention.
Figure 18B:
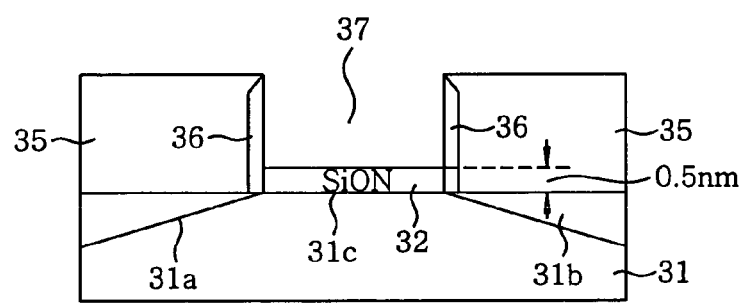

FIGS. 18(A) to 19(E) illustrate a manufacturing process of a semiconductor device in accordance with a second embodiment of the present invention. Referring to FIG. 18(A), in the substrate processing unit 20 shown in FIG. 1, a silicon substrate 31 having diffusion areas 31a and 31b which are formed by employing an ion implantation of impure elements is exposed through a hole 37 in insulating layers 35 and 36 and a UV-NO process is performed on an exposed surface 31C of the silicon substrate 31 without a native oxide film by using an ultraviolet light of 172 nm wavelength under the above-described conditions. As a result, as shown in FIG. 18(B), a SiON film 32 having a constant thickness of about 0.5 nm is formed on the surface of the silicon substrate 31 by the aforementioned stoppage of film forming.

Figure 18C:
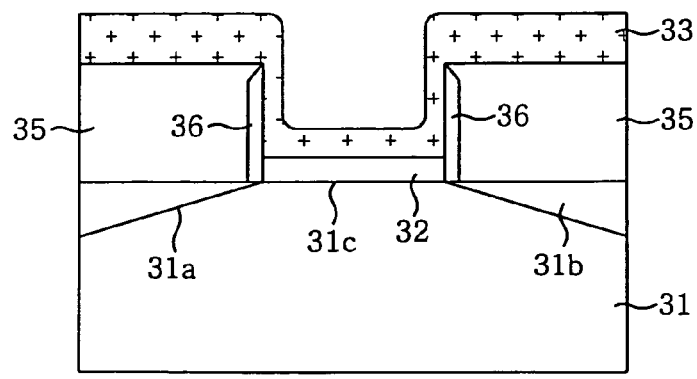

Next, in a process shown in FIG. 18(C), a high dielectric constant film 33 such as ZrSiO$_x$, HfSiO$_x$, ZrO$_2$, HfO$_2$, Ta$_2$O$_5$, or Al$_2$O$_3$ is built up on the SiON film 32 by CVD method.

Figure 19D:
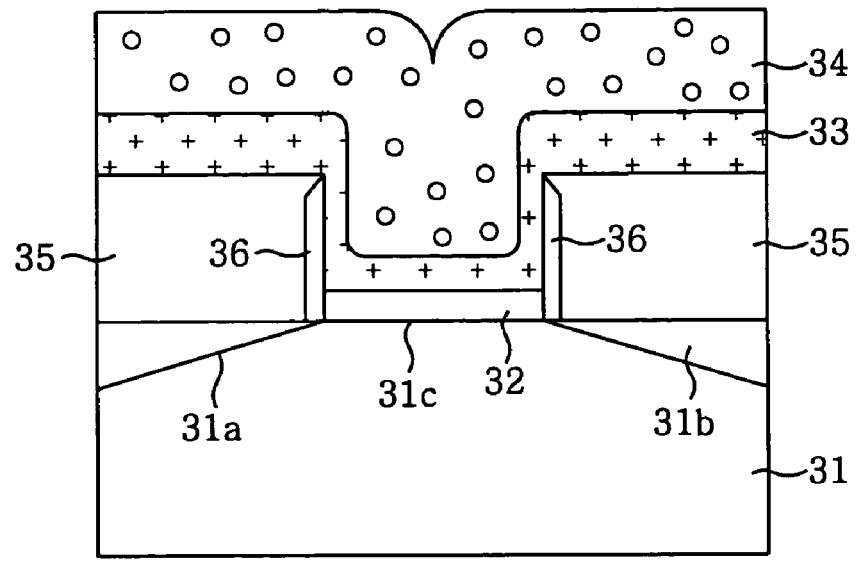
FIGS. 19(D) and 19(E) represent a process of manufacturing a semiconductor device in accordance with the second embodiment of the present invention.
Figure 19E:
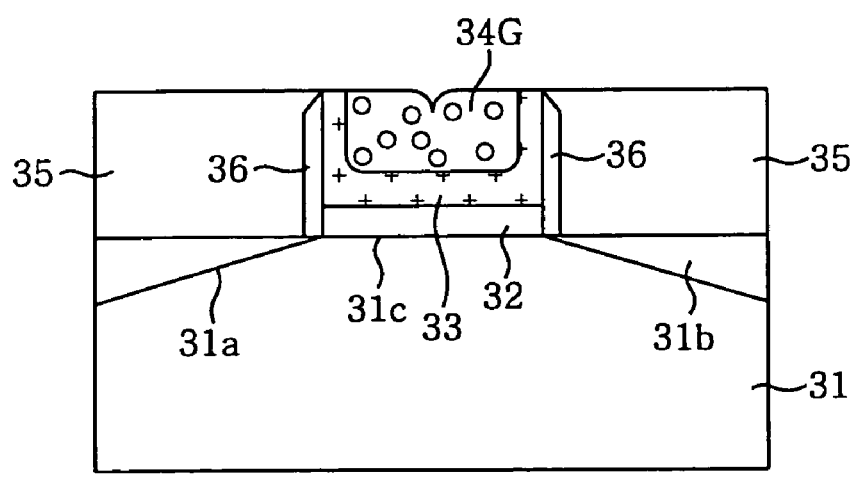

Further, in a process shown in FIG. 19(D), a metal electrode layer 34 is built up on the high dielectric constant film 33 thus formed and, in a process shown in FIG. 19(E), a metal gate electrode 34G is formed by electrode etching. In the present embodiment, it is preferable that UV-NO oxynitriding shown in FIG. 18(A) is performed at a temperature of 550° C. or lower and at a processing pressure of 1.33 to 1.33×10$^{-3}$ Pa.

In accordance with the present invention, by irradiating an ultraviolet light on a surface of a silicon substrate without oxygen, it is possible to remove carbon on the surface of the silicon substrate and to stably form an oxynitride film without being affected by the organic contamination. Further, an oxide film can be also formed stably by the same method in addition to the oxynitride film.

While the invention has been shown and described with respect to the preferred embodiments, it will be understood by those skilled in the art that various changes and modifications may be without departing from the spirit and scope of the invention as defined in the following claims.

What is claimed is:

1. A substrate processing method, comprising the steps of:
   removing carbon from a surface of a silicon substrate by irradiating a first ultraviolet light on the surface in an essentially ultraviolet nonreactive gas atmosphere; and
   forming an oxynitride film on the surface of the silicon substrate by irradiating a second ultraviolet light thereon in an essentially ultraviolet reactive gas atmosphere of NO.

2. A computer readable storage medium storing therein a program for controlling a substrate processing method, the method comprising the steps of:
   removing carbon from a surface of a silicon substrate by irradiating a first ultraviolet light on the surface in an essentially ultraviolet nonreactive gas atmosphere; and
   forming an oxynitride film on the surface of the silicon substrate by irradiating a second ultraviolet light thereon in an essentially ultraviolet reactive gas atmosphere of NO.

3. A substrate processing method, comprising the steps of:
   removing carbon from a surface of a silicon substrate by irradiating a first ultraviolet light on the surface in a nitrogen gas atmosphere;
   supplying a NO gas to the surface of the silicon substrate; and
   exciting the NO gas by a second ultraviolet light to form an oxynitride film on the surface of the silicon substrate,
   wherein the nitrogen gas atmosphere is essentially nonreactive to the first ultraviolet light.

4. The substrate processing method of claim 3, wherein the second ultraviolet light has a wavelength ranging from 145 to 192 nm.

5. The substrate processing method of claim 3, wherein the ultraviolet light has a wavelength of about 172 nm.

6. A computer readable storage medium storing therein a program for controlling a substrate processing method, the method comprising the steps of:
   removing carbon from a surface of a silicon substrate by irradiating a first ultraviolet light on the surface in a nitrogen gas atmosphere;
   supplying a NO gas to the surface of the silicon substrate; and
   exciting the NO gas by a second ultraviolet light to form an oxynitride film on the surface of the silicon substrate,
   wherein the nitrogen gas atmosphere is essentially nonreactive to the first ultraviolet light.

7. A substrate processing method, comprising the steps of:
   loading a silicon substrate into a processing chamber;
   while heating the silicon substrate, removing carbon from a surface of a silicon substrate by irradiating an ultraviolet light on the surface in an essentially ultraviolet nonreactive gas atmosphere; and
   forming an oxynitride film on the surface of the silicon substrate by irradiating a second ultraviolet light thereon in an essentially ultraviolet reactive gas atmosphere,
   wherein the step of removing the carbon is performed at a temperature of the silicon substrate not exceeding 450° C., and
   wherein the essentially ultraviolet reactive gas atmosphere is a NO gas atmosphere.

8. A computer readable storage medium storing therein a program for controlling a substrate processing method, the method comprising the steps of:
   loading a silicon substrate into a processing chamber;
   while heating the silicon substrate, removing carbon from a surface of a silicon substrate by irradiating a first ultraviolet light on the surface in an essentially ultraviolet nonreactive gas atmosphere; and
   forming an oxynitride film on the surface of the silicon substrate by irradiating a second ultraviolet light thereon in an essentially ultraviolet reactive gas atmosphere of NO,
   wherein the step of removing the carbon is performed at a temperature of the silicon substrate not exceeding 450° C.

9. A substrate processing method, comprising the steps of:
   loading a silicon substrate into a processing chamber;
   while heating the silicon substrate, removing carbon from a surface of the silicon substrate by irradiating a first ultraviolet light on the surface in an essentially ultraviolet nonreactive gas atmosphere; and forming an oxynitride film on the surface of the silicon substrate by irradiating a second ultraviolet light thereon in an essentially ultraviolet reactive gas atmosphere, wherein the step of removing the carbon and the step of forming the oxynitride film are performed in the same processing chamber, and wherein the essentially ultraviolet reactive gas atmosphere is a NO gas atmosphere.

10. The substrate processing method of claim 9, wherein the step of removing the carbon is performed at a temperature of the silicon substrate not exceeding 450° C.

11. A computer readable storage medium storing therein a program for controlling a substrate processing method, the method comprising the steps of:

loading a silicon substrate into a processing chamber;

while heating the silicon substrate, removing carbon from a surface of the silicon substrate by irradiating a first ultraviolet light on the surface in an essentially ultraviolet nonreactive gas atmosphere; and forming an oxynitride film on the surface of the silicon substrate by irradiating a second ultraviolet light thereon in an essentially ultraviolet reactive gas atmosphere of NO, wherein the step of removing the carbon and the step of forming the oxynitride film are performed in the same processing chamber.

12. A substrate processing method, comprising the steps of:

removing carbon from a surface of a silicon substrate by irradiating a first ultraviolet light on the surface in a nitrogen gas atmosphere;

supplying a NO gas to the surface of the silicon substrate; and exciting the NO gas by a second ultraviolet light to form an oxynitride film on the surface of the silicon substrate, wherein the nitrogen gas atmosphere is essentially nonreactive to the first ultraviolet light and wherein the steps are performed successively to control a nitrogen concentration in the oxynitride film.

13. A computer readable storage medium storing therein a program for controlling a substrate processing method, the method comprising the steps of:

removing carbon from a surface of a silicon substrate by irradiating a first ultraviolet light on the surface in a nitrogen gas atmosphere;

supplying a NO gas to the surface of the silicon substrate; and exciting the NO gas by a second ultraviolet light to form an oxynitride film on the surface of the silicon substrate, wherein the nitrogen gas atmosphere is essentially nonreactive to the first ultraviolet light and wherein the steps are performed successively to control a nitrogen concentration in the oxynitride film.

14. A substrate processing method, comprising the steps of:

removing carbon from a surface of a silicon substrate by irradiating a first ultraviolet light on the surface in an atmosphere of a nitrogen gas; and forming an oxynitride film on the surface of the silicon substrate by irradiating a second ultraviolet light thereon in an atmosphere of a NO oxidizing gas, wherein the first ultraviolet light has a wavelength not exciting the nitrogen gas and the second ultraviolet light has a wavelength exciting the NO oxidizing gas.

15. The substrate processing method of claim 14, wherein the step of removing the carbon is performed while heating the silicon substrate at a temperature not exceeding 450° C.

16. The substrate processing method of claim 1, wherein the first ultraviolet light is identical to the second ultraviolet light.

17. The substrate processing method of claim 3, wherein the first ultraviolet light is identical to the second ultraviolet light.

* * * * *

UNITED STATES PATENT AND TRADEMARK OFFICE
CERTIFICATE OF CORRECTION

| | | |
|---|---|---|
| PATENT NO. | : 7,129,185 B2 | Page 1 of 1 |
| APPLICATION NO. | : 10/967284 | |
| DATED | : October 31, 2006 | |
| INVENTOR(S) | : Aoyama et al. | |

It is certified that error appears in the above-identified patent and that said Letters Patent is hereby corrected as shown below:

On the title page, Item (30), the Foreign Application Priority Data has been omitted. Item (30) should read:

-- (30) Foreign Application Priority Data

Apr. 19, 2002  (JP) ………………….. 2002-117930

Signed and Sealed this

Ninth Day of January, 2007

JON W. DUDAS
*Director of the United States Patent and Trademark Office*